United States Patent
Luch

(10) Patent No.: US 8,729,385 B2
(45) Date of Patent: May 20, 2014

(54) COLLECTOR GRID AND INTERCONNECT STRUCTURES FOR PHOTOVOLTAIC ARRAYS AND MODULES

(71) Applicant: Daniel Luch, Morgan Hill, CA (US)

(72) Inventor: Daniel Luch, Morgan Hill, CA (US)

( * ) Notice: Subject to any disclaimer, the term of this patent is extended or adjusted under 35 U.S.C. 154(b) by 0 days.

(21) Appl. No.: 13/694,893

(22) Filed: Jan. 15, 2013

(65) Prior Publication Data

US 2013/0255744 A1    Oct. 3, 2013

Related U.S. Application Data

(63) Continuation-in-part of application No. 13/385,207, filed on Feb. 6, 2012, which is a continuation-in-part of application No. 12/803,490, filed on Jun. 29, 2010, now Pat. No. 8,138,413, which is a continuation-in-part of application No. 12/798,221, filed on Mar. 31, 2010, now Pat. No. 8,076,568, which is a continuation-in-part of application No. 11/980,010, filed on Oct. 29, 2007, now abandoned, said application No. 13/694,893 is a continuation-in-part of application No. 13/385,207, filed on Feb. 6, 2012, which is a continuation-in-part of application No. 13/317,117, filed on Oct. 11, 2011, now Pat. No. 8,222,513, which is a continuation-in-part of application No. 13/199,333, filed on Aug. 25, 2011, now Pat. No. 8,110,737, which is a continuation of application No. 12/290,896, filed on Nov. 5, 2008, now abandoned, which is a continuation-in-part of application No. 11/824,047, filed on Jun. 30, 2007, now abandoned, which is a continuation-in-part of application No. 11/404,168, filed on Apr. 13, 2006, now Pat. No. 7,635,810, said application No. 13/694,893 is a continuation-in-part of application No. 13/385,207, filed on Feb. 6, 2012, which is a continuation-in-part of application No. 12/590,222, filed on Nov. 3, 2009, which is a continuation-in-part of application No. 12/156,505, filed on Jun. 2, 2008, now abandoned.

(60) Provisional application No. 61/274,960, filed on Aug. 24, 2009.

(51) Int. Cl.
*H01L 31/00* (2006.01)
*H01L 31/042* (2014.01)
*H02N 6/00* (2006.01)

(52) U.S. Cl.
USPC ............................ 136/256; 136/244; 136/245

(58) Field of Classification Search
USPC ........................ 136/244, 245, 249, 251, 256
See application file for complete search history.

(56) References Cited

U.S. PATENT DOCUMENTS

| | | |
|---|---|---|
| 3,094,439 A | 6/1963 | Mann at al. |
| 3,116,171 A | 12/1963 | Leif et al. |

(Continued)

OTHER PUBLICATIONS

Japanese Unexamined Patent Application Publication H06-196743 Nobuyoshi Takehara et al. Publication date Jul. 15, 1994.

*Primary Examiner* — Jonathan Johnson
*Assistant Examiner* — Lindsey Bernier

(57) ABSTRACT

A interconnected arrangement of photovoltaic cells is readily and efficiently achieved by using a unique interconnecting strap. The strap comprises electrically conductive fingers which contact the top light incident surface of a first cell and extend to an interconnect region of the strap. The interconnect region may include through holes which allow electrical communication between top and bottom surfaces of the interconnect region. In one embodiment, the electrically conductive surface of the fingers is in electrical communication with an electrically conductive surface formed on the opposite side of the strap through the through holes of the interconnect region. The interconnection strap may comprise a laminating film to facilitate manufacture and assembly of the interconnected arrangement.

26 Claims, 7 Drawing Sheets

(56) References Cited

U.S. PATENT DOCUMENTS

| | | |
|---|---|---|
| 3,330,700 A | 7/1967 | Sequeira et al. |
| 3,346,419 A | 10/1967 | Webb et al. |
| 3,369,939 A | 2/1968 | Meyer |
| 3,376,163 A | 4/1968 | Abrahamsohn |
| 3,442,007 A | 5/1969 | Griffin et al. |
| 3,459,391 A | 8/1969 | Haynos |
| 3,459,597 A | 8/1969 | Baron |
| 3,480,473 A | 11/1969 | Tanos |
| 3,483,038 A | 12/1969 | Hui et al. |
| 3,523,875 A | 8/1970 | Minklei |
| 3,553,030 A | 1/1971 | Lebrun |
| 3,571,915 A | 3/1971 | Shirland |
| 3,619,382 A | 11/1971 | Lupinski |
| 3,682,786 A | 8/1972 | Brown et al. |
| 3,713,893 A | 1/1973 | Shirland |
| 3,764,280 A | 10/1973 | Lupinski |
| 3,818,324 A | 6/1974 | Espinasse |
| 3,849,880 A | 11/1974 | Haynos |
| 3,865,699 A | 2/1975 | Luch |
| 3,888,697 A | 6/1975 | Bogus et al. |
| 3,903,427 A | 9/1975 | Pack |
| 3,903,428 A | 9/1975 | DeJong |
| 3,978,333 A | 8/1976 | Crisman et al. |
| 3,982,964 A | 9/1976 | Lindmayer et al. |
| 3,993,505 A | 11/1976 | Pack |
| 3,996,067 A | 12/1976 | Broder |
| 4,009,093 A | 2/1977 | Luch |
| 4,017,332 A | 4/1977 | James |
| 4,019,924 A | 4/1977 | Kurth |
| 4,027,652 A | 6/1977 | Collura |
| 4,038,042 A | 7/1977 | Adelman |
| 4,046,951 A | 9/1977 | Stefanik |
| 4,064,552 A | 12/1977 | Angelucci et al. |
| 4,080,703 A | 3/1978 | Evans et al. |
| 4,087,960 A | 5/1978 | Koichi |
| 4,101,385 A | 7/1978 | Luch |
| 4,127,424 A | 11/1978 | Ullery |
| 4,146,012 A | 3/1979 | Elkins et al. |
| 4,158,612 A | 6/1979 | Luch et al. |
| 4,173,496 A | 11/1979 | Chiang et al. |
| 4,175,249 A | 11/1979 | Gruber |
| 4,195,117 A | 3/1980 | Luch |
| 4,200,472 A | 4/1980 | Chappell et al. |
| 4,221,465 A | 9/1980 | Hannan et al. |
| 4,227,942 A | 10/1980 | Hall |
| 4,231,808 A | 11/1980 | Tabei |
| 4,233,085 A | 11/1980 | Roderick et al. |
| 4,241,493 A | 12/1980 | Andrulitis et al. |
| 4,242,696 A | 12/1980 | Diguet et al. |
| 4,243,432 A | 1/1981 | Jordan |
| 4,254,546 A | 3/1981 | Ullery |
| 4,256,513 A | 3/1981 | Yoshida et al. |
| 4,260,428 A | 4/1981 | Roy |
| 4,260,429 A | 4/1981 | Moyer |
| 4,278,473 A | 7/1981 | Borden |
| 4,278,510 A | 7/1981 | Chien et al. |
| 4,283,590 A | 8/1981 | Bilger et al. |
| 4,283,591 A | 8/1981 | Boer |
| 4,291,191 A | 9/1981 | Dahlberg |
| 4,306,108 A | 12/1981 | Henesian |
| 4,315,096 A | 2/1982 | Tyan et al. |
| 4,318,938 A | 3/1982 | Barnett et al. |
| 4,320,154 A | 3/1982 | Biter |
| 4,330,680 A | 5/1982 | Goetzberger |
| 4,341,918 A | 7/1982 | Evans et al. |
| 4,348,546 A | 9/1982 | Little |
| 4,361,717 A | 11/1982 | Gilmore et al. |
| 4,366,335 A | 12/1982 | Feng et al. |
| 4,376,872 A | 3/1983 | Evans et al. |
| 4,380,112 A | 4/1983 | Little |
| 4,395,362 A | 7/1983 | Satoh et al. |
| 4,398,055 A | 8/1983 | Ijaz et al. |
| 4,425,262 A | 1/1984 | Kawai et al. |
| 4,428,110 A | 1/1984 | Kim |
| 4,429,020 A | 1/1984 | Luch |
| 4,430,519 A | 2/1984 | Young |
| 4,443,651 A | 4/1984 | Swartz |
| 4,443,652 A | 4/1984 | Izu |
| 4,443,653 A | 4/1984 | Catalano et al. |
| 4,457,578 A | 7/1984 | Taylor |
| 4,499,658 A | 2/1985 | Lewis |
| 4,507,181 A | 3/1985 | Nath et al. |
| 4,510,079 A | 4/1985 | Kawai et al. |
| 4,514,579 A | 4/1985 | Hanak |
| 4,514,580 A | 4/1985 | Bartlett |
| 4,517,403 A | 5/1985 | Morel et al. |
| 4,537,838 A | 8/1985 | Jetter et al. |
| 4,542,255 A | 9/1985 | Tanner et al. |
| 4,567,642 A | 2/1986 | Dilts et al. |
| 4,574,160 A | 3/1986 | Cull |
| 4,584,427 A | 4/1986 | Mackamul et al. |
| 4,585,490 A | 4/1986 | Raffel et al. |
| 4,586,988 A | 5/1986 | Nath et al. |
| 4,598,306 A | 7/1986 | Nath et al. |
| 4,603,092 A | 7/1986 | Luch |
| 4,603,470 A | 8/1986 | Yamazaki |
| 4,605,813 A | 8/1986 | Takeuchi et al. |
| 4,609,770 A | 9/1986 | Nishiura et al. |
| 4,617,420 A | 10/1986 | Dilts et al. |
| 4,617,421 A | 10/1986 | Nath et al. |
| 4,624,045 A | 11/1986 | Ishihara et al. |
| 4,628,144 A | 12/1986 | Burger |
| 4,640,002 A | 2/1987 | Phillips et al. |
| 4,652,693 A * | 3/1987 | Bar-On .................... 136/251 |
| 4,667,060 A | 5/1987 | Spitzer |
| 4,667,128 A | 5/1987 | Kamijo et al. |
| 4,675,468 A | 6/1987 | Basol et al. |
| 4,692,557 A | 9/1987 | Samuelson et al. |
| 4,694,117 A | 9/1987 | Friedrich et al. |
| 4,695,674 A | 9/1987 | Bar-on |
| 4,697,041 A | 9/1987 | Okaniwa et al. |
| 4,697,042 A | 9/1987 | Schilling |
| 4,698,455 A | 10/1987 | Cavicchi et al. |
| 4,703,553 A | 11/1987 | Mardesich |
| 4,704,369 A | 11/1987 | Nath et al. |
| 4,724,011 A | 2/1988 | Turner et al. |
| 4,735,662 A | 4/1988 | Szabo et al. |
| 4,745,078 A | 5/1988 | Stetter et al. |
| 4,746,618 A | 5/1988 | Nath et al. |
| 4,755,475 A | 7/1988 | Kiyama et al. |
| 4,758,526 A | 7/1988 | Thalheimer |
| 4,762,747 A | 8/1988 | Liu et al. |
| 4,765,845 A | 8/1988 | Takada et al. |
| 4,769,086 A | 9/1988 | Tanner et al. |
| 4,773,944 A | 9/1988 | Nath |
| 4,783,421 A | 11/1988 | Carlson et al. |
| 4,786,607 A | 11/1988 | Yamazaki et al. |
| 4,806,432 A | 2/1989 | Eguchi et al. |
| 4,830,038 A | 5/1989 | Anderson et al. |
| 4,849,029 A | 7/1989 | Delahoy |
| 4,860,509 A | 8/1989 | Laaly et al. |
| 4,865,999 A | 9/1989 | Xi et al. |
| 4,872,607 A | 10/1989 | Jensen |
| 4,872,925 A | 10/1989 | McMaster |
| 4,873,201 A | 10/1989 | Grimmer |
| 4,876,430 A | 10/1989 | Hershitz et al. |
| 4,877,460 A | 10/1989 | Flodl |
| 4,888,061 A | 12/1989 | Wenz |
| 4,892,592 A | 1/1990 | Dickson |
| 4,917,752 A | 4/1990 | Jensen |
| 4,933,021 A | 6/1990 | Swanson |
| 4,940,495 A | 7/1990 | Weber |
| 4,965,655 A | 10/1990 | Grimmer et al. |
| 4,981,525 A | 1/1991 | Kiyama et al. |
| 4,993,021 A | 2/1991 | Nannicini et al. |
| 5,008,062 A | 4/1991 | Anderson et al. |
| 5,009,720 A | 4/1991 | Hokuyo et al. |
| 5,011,567 A | 4/1991 | Gonsiorawski |
| 5,021,099 A | 6/1991 | Kim et al. |
| 5,057,163 A | 10/1991 | Barnett et al. |
| 5,078,803 A | 1/1992 | Pier et al. |
| 5,084,107 A | 1/1992 | Deguchi et al. |
| 5,100,808 A | 3/1992 | Glenn |
| 5,118,361 A | 6/1992 | Fraas et al. |

(56) References Cited

U.S. PATENT DOCUMENTS

| | | |
|---|---|---|
| 5,118,540 A | 6/1992 | Hutchison |
| 5,125,983 A | 6/1992 | Cummings |
| 5,127,964 A | 7/1992 | Hamakawa et al. |
| 5,139,959 A | 8/1992 | Craft et al. |
| 5,151,373 A | 9/1992 | Deguchi |
| 5,158,618 A | 10/1992 | Rubin et al. |
| 5,164,019 A | 11/1992 | Sinton |
| 5,164,443 A | 11/1992 | Watanabe |
| 5,180,442 A | 1/1993 | Elias |
| 5,181,968 A | 1/1993 | Nath et al. |
| 5,185,042 A | 2/1993 | Ferguson |
| 5,202,271 A | 4/1993 | Kouzuma |
| 5,223,044 A | 6/1993 | Asai |
| 5,232,518 A | 8/1993 | Nath et al. |
| 5,238,519 A | 8/1993 | Nath et al. |
| 5,248,347 A | 9/1993 | Ochi |
| 5,254,179 A | 10/1993 | Ricaud et al. |
| 5,259,891 A | 11/1993 | Matsuyama |
| 5,268,037 A | 12/1993 | Glatfelter |
| 5,270,229 A | 12/1993 | Ishihara |
| 5,273,608 A | 12/1993 | Nath |
| 5,278,097 A | 1/1994 | Hotchkiss |
| 5,296,043 A | 3/1994 | Kawakami |
| 5,330,583 A | 7/1994 | Asai et al. |
| 5,380,371 A | 1/1995 | Murakami |
| 5,385,848 A | 1/1995 | Grimmer |
| 5,389,158 A | 2/1995 | Fraas et al. |
| 5,391,235 A | 2/1995 | Inoue |
| 5,391,236 A | 2/1995 | Krut et al. |
| 5,409,549 A | 4/1995 | Mori |
| 5,419,781 A | 5/1995 | Hamakawa et al. |
| 5,421,908 A | 6/1995 | Yoshida et al. |
| 5,428,249 A | 6/1995 | Sawayama et al. |
| 5,437,735 A | 8/1995 | Younan |
| 5,457,057 A | 10/1995 | Nath et al. |
| 5,466,302 A | 11/1995 | Carey et al. |
| 5,468,652 A | 11/1995 | Gee |
| 5,474,620 A | 12/1995 | Nath et al. |
| 5,474,621 A | 12/1995 | Barnard |
| 5,474,622 A | 12/1995 | Negami et al. |
| 5,491,427 A | 2/1996 | Ueno et al. |
| 5,498,297 A | 3/1996 | O'Neill |
| 5,501,744 A | 3/1996 | Albright |
| 5,516,704 A | 5/1996 | Yoshida |
| 5,530,519 A | 6/1996 | Miyawaki et al. |
| 5,543,726 A | 8/1996 | Boyette et al. |
| 5,543,729 A | 8/1996 | Henley |
| 5,547,516 A | 8/1996 | Luch |
| 5,554,229 A | 9/1996 | Vogeli |
| 5,567,296 A | 10/1996 | Luch |
| 5,575,861 A | 11/1996 | Younan et al. |
| 5,582,653 A | 12/1996 | Kataoka |
| 5,587,264 A | 12/1996 | Iijima et al. |
| 5,593,901 A | 1/1997 | Oswald et al. |
| 5,595,607 A | 1/1997 | Wenham et al. |
| 5,597,422 A | 1/1997 | Kataoka et al. |
| 5,616,185 A | 4/1997 | Kukulka |
| 5,620,528 A | 4/1997 | Schade et al. |
| 5,626,686 A | 5/1997 | Yoshida |
| 5,626,688 A | 5/1997 | Probst et al. |
| 5,637,537 A | 6/1997 | Nath et al. |
| 5,651,837 A | 7/1997 | Ohtsuka et al. |
| 5,667,596 A | 9/1997 | Tsuzuki et al. |
| 5,674,325 A | 10/1997 | Albright et al. |
| 5,679,176 A | 10/1997 | Tsuzuki et al. |
| 5,681,402 A | 10/1997 | Ichinose et al. |
| 5,728,230 A | 3/1998 | Komoir et al. |
| 5,733,381 A | 3/1998 | Ota et al. |
| 5,735,966 A | 4/1998 | Luch |
| 5,741,370 A | 4/1998 | Hanoka |
| 5,759,291 A | 6/1998 | Ichinose et al. |
| 5,762,720 A | 6/1998 | Hanoka et al. |
| 5,814,195 A | 9/1998 | Lehan et al. |
| 5,854,940 A | 12/1998 | Nihara |
| 5,858,121 A | 1/1999 | Wada |
| 5,865,904 A | 2/1999 | Tanda |
| 5,868,869 A | 2/1999 | Albright et al. |
| 5,871,591 A | 2/1999 | Ruby et al. |
| 5,897,715 A | 4/1999 | Ward et al. |
| 5,909,124 A | 6/1999 | Madine et al. |
| 5,919,316 A | 7/1999 | Bogorad et al. |
| 5,928,439 A | 7/1999 | Ota et al. |
| 5,942,048 A | 8/1999 | Fujisaki et al. |
| 5,951,786 A | 9/1999 | Gee et al. |
| 5,968,287 A | 10/1999 | Nath |
| 5,986,203 A | 11/1999 | Hanoka et al. |
| 5,990,415 A | 11/1999 | Green et al. |
| 6,008,451 A | 12/1999 | Ichinose et al. |
| 6,034,322 A | 3/2000 | Pollard |
| 6,034,323 A | 3/2000 | Yamada et al. |
| 6,034,810 A | 3/2000 | Robinson et al. |
| 6,077,091 A | 6/2000 | McKenna-Olson et al. |
| 6,083,801 A | 7/2000 | Ohtani |
| 6,091,021 A | 7/2000 | Ruby et al. |
| 6,093,581 A | 7/2000 | Takabayashi |
| 6,093,882 A | 7/2000 | Arimoto |
| 6,093,884 A | 7/2000 | Toyomura et al. |
| 6,111,189 A | 8/2000 | Garvison et al. |
| 6,114,046 A | 9/2000 | Hanoka |
| 6,121,542 A | 9/2000 | Shiotsuka et al. |
| 6,128,868 A | 10/2000 | Ohtsuka et al. |
| 6,137,221 A | 10/2000 | Roitman et al. |
| 6,144,216 A | 11/2000 | Kajiwara et al. |
| 6,160,215 A | 12/2000 | Curtin |
| 6,172,297 B1 | 1/2001 | Hezel et al. |
| 6,184,458 B1 | 2/2001 | Murakami et al. |
| 6,201,181 B1 | 3/2001 | Azzam et al. |
| 6,207,889 B1 | 3/2001 | Toyomura et al. |
| 6,231,732 B1 | 5/2001 | Hollars et al. |
| 6,232,544 B1 | 5/2001 | Takabayashi |
| 6,239,352 B1 | 5/2001 | Luch |
| 6,245,987 B1 | 6/2001 | Shiomi et al. |
| 6,248,948 B1 | 6/2001 | Nakagawa et al. |
| 6,265,652 B1 | 7/2001 | Kurata et al. |
| 6,265,812 B1 | 7/2001 | Watanabe et al. |
| 6,268,014 B1 | 7/2001 | Eberspacher et al. |
| 6,294,725 B1 | 9/2001 | Hirshberg |
| 6,313,395 B1 | 11/2001 | Crane et al. |
| 6,323,478 B1 | 11/2001 | Fujisaki et al. |
| 6,333,206 B1 | 12/2001 | Ito et al. |
| 6,335,479 B1 | 1/2002 | Yamada et al. |
| 6,340,403 B1 | 1/2002 | Carey et al. |
| 6,342,669 B1 | 1/2002 | Sakai et al. |
| 6,344,736 B1 | 2/2002 | Kerrigan et al. |
| 6,350,944 B1 | 2/2002 | Sheri et al. |
| 6,359,209 B1 | 3/2002 | Glenn et al. |
| 6,365,010 B1 | 4/2002 | Hollars |
| 6,372,538 B1 | 4/2002 | Wendt et al. |
| 6,379,995 B1 | 4/2002 | Kawama et al. |
| 6,380,477 B1 | 4/2002 | Curtin |
| 6,384,313 B2 | 5/2002 | Nakagawa et al. |
| 6,414,235 B1* | 7/2002 | Luch ........................... 136/244 |
| 6,422,793 B1 | 7/2002 | Todisco et al. |
| 6,437,231 B2 | 8/2002 | Kurata et al. |
| 6,437,236 B2 | 8/2002 | Watanabe et al. |
| 6,441,297 B1 | 8/2002 | Keller et al. |
| 6,452,086 B1 | 9/2002 | Muller |
| 6,455,347 B1 | 9/2002 | Hiraishi et al. |
| 6,459,032 B1 | 10/2002 | Luch |
| 6,468,828 B1 | 10/2002 | Glatfelter et al. |
| 6,472,594 B1 | 10/2002 | Ichinose et al. |
| 6,479,744 B1 | 11/2002 | Tsuzuki et al. |
| 6,488,824 B1 | 12/2002 | Hollars |
| 6,511,861 B2 | 1/2003 | Takeyama et al. |
| 6,521,825 B2 | 2/2003 | Miura et al. |
| 6,524,880 B2 | 2/2003 | Moon et al. |
| 6,531,653 B1 | 3/2003 | Glenn et al. |
| 6,534,702 B1 | 3/2003 | Makita et al. |
| 6,541,695 B1 | 4/2003 | Mowles |
| 6,548,912 B1 | 4/2003 | Graff et al. |
| 6,552,414 B1 | 4/2003 | Horzel et al. |
| 6,553,729 B1 | 4/2003 | Nath et al. |
| 6,555,739 B2 | 4/2003 | Kawam |
| 6,573,445 B1 | 6/2003 | Burgers |

(56) References Cited

U.S. PATENT DOCUMENTS

| | | |
|---|---|---|
| 6,576,830 B2 | 6/2003 | Nagao et al. |
| 6,582,887 B2 | 6/2003 | Luch |
| 6,586,270 B2 | 7/2003 | Tsuzuki et al. |
| 6,593,520 B2 | 7/2003 | Kondo et al. |
| 6,617,507 B2 | 9/2003 | Mapes et al. |
| 6,620,645 B2 | 9/2003 | Chandra et al. |
| 6,624,050 B2 | 9/2003 | Matsushita et al. |
| 6,653,549 B2 | 11/2003 | Matsushita et al. |
| 6,653,718 B2 | 11/2003 | Leung et al. |
| 6,660,930 B1 | 12/2003 | Gonsiorawsk |
| 6,663,944 B2 | 12/2003 | Park et al. |
| 6,670,541 B2 | 12/2003 | Nagao et al. |
| 6,690,041 B2 | 2/2004 | Armstrong et al. |
| 6,697,248 B1 | 2/2004 | Luch |
| 6,706,963 B2 | 3/2004 | Gaudiana et al. |
| 6,729,081 B2 | 5/2004 | Nath et al. |
| 6,741,087 B2 | 5/2004 | Kimura et al. |
| 6,743,524 B2 | 6/2004 | Schaepkens |
| 6,750,662 B1 | 6/2004 | Van Der Heide |
| 6,756,290 B1 | 6/2004 | Bultman |
| 6,774,497 B1 | 8/2004 | Qi et al. |
| 6,784,358 B2 | 8/2004 | Kukulka et al. |
| 6,784,360 B2 | 8/2004 | Nakajima et al. |
| 6,787,405 B2 | 9/2004 | Chen |
| 6,803,513 B2 | 10/2004 | Beernink et al. |
| 6,806,414 B2 | 10/2004 | Shiotsuka et al. |
| 6,807,059 B1 | 10/2004 | Dale |
| 6,819,389 B2 | 11/2004 | Imayama et al. |
| 6,825,104 B2 | 11/2004 | Horzel et al. |
| 6,846,696 B2 | 1/2005 | Adachi et al. |
| 6,884,466 B2 | 4/2005 | Kaloyeros et al. |
| 6,906,253 B2 | 6/2005 | Bauman et al. |
| 6,936,761 B2 | 8/2005 | Pichler |
| 6,952,530 B2 | 10/2005 | Helvajian et al. |
| 6,953,599 B2 | 10/2005 | Shiotsuka et al. |
| 6,956,163 B2 | 10/2005 | McFarland |
| 6,959,517 B2 | 11/2005 | Poddany et al. |
| 6,960,716 B2 | 11/2005 | Matsumi et al. |
| 6,967,115 B1 | 11/2005 | Sheats |
| 6,974,976 B2 | 12/2005 | Hollars |
| 6,982,218 B2 | 1/2006 | Preu et al. |
| 6,983,536 B2 | 1/2006 | Farnworth et al. |
| 7,022,910 B2 | 4/2006 | Gaudiana et al. |
| 7,030,410 B2 | 4/2006 | Moore |
| 7,042,029 B2 | 5/2006 | Graetzel et al. |
| 7,053,294 B2 | 5/2006 | Tuttle |
| 7,087,834 B2 | 8/2006 | McFarland |
| 7,091,136 B2 | 8/2006 | Basol |
| 7,115,504 B2 | 10/2006 | Moore et al. |
| 7,120,005 B1 | 10/2006 | Luch |
| 7,122,398 B1 | 10/2006 | Pichler |
| 7,135,405 B2 | 11/2006 | Weng et al. |
| 7,144,751 B2 | 12/2006 | Gee et al. |
| 7,153,722 B2 | 12/2006 | Shimizu |
| 7,157,641 B2 | 1/2007 | Gregg |
| 7,170,001 B2 | 1/2007 | Tee et al. |
| 7,196,459 B2 | 3/2007 | Morris |
| 7,239,161 B2 | 7/2007 | Iwanaga et al. |
| 7,253,354 B2 | 8/2007 | Van Roosmalen et al. |
| 7,271,333 B2 | 9/2007 | Fabick et al. |
| 7,276,724 B2 | 10/2007 | Sheats et al. |
| 7,297,867 B2 | 11/2007 | Nomura et al. |
| 7,304,361 B2 | 12/2007 | Brabec et al. |
| 7,307,209 B2 | 12/2007 | Mapes et al. |
| 7,335,555 B2 | 2/2008 | Gee et al. |
| 7,335,835 B2 | 2/2008 | Kukulka et al. |
| 7,342,171 B2 | 3/2008 | Stevenson et al. |
| 7,355,114 B2 | 4/2008 | Ojima et al. |
| 7,365,266 B2 | 4/2008 | Heckeroth |
| 7,375,378 B2 | 5/2008 | Manivannan et al. |
| 7,394,425 B2 | 7/2008 | Luch |
| 7,406,800 B2 | 8/2008 | Cinnamon |
| 7,432,438 B2 | 10/2008 | Rubin et al. |
| 7,452,656 B2 | 11/2008 | Luch |
| 8,019,467 B2 | 1/2009 | Croft et al. |
| 7,507,903 B2 | 3/2009 | Luch |
| 7,507,971 B2 | 3/2009 | Shibayama et al. |
| 7,541,096 B2 | 6/2009 | Rogers et al. |
| 7,544,884 B2 | 6/2009 | Hollars |
| 7,635,810 B2 | 12/2009 | Luch |
| 7,649,141 B2 | 1/2010 | Schmit et al. |
| 7,671,620 B2 | 3/2010 | Manz |
| 7,709,051 B2 | 5/2010 | Spath et al. |
| 7,732,243 B2 | 6/2010 | Luch |
| 7,736,940 B2 | 6/2010 | Basol |
| 7,772,484 B2 | 8/2010 | Li et al. |
| 7,777,128 B2 | 8/2010 | Montello et al. |
| 7,781,672 B2 | 8/2010 | Gaudiana et al. |
| 7,829,781 B2 | 11/2010 | Montello et al. |
| 7,829,783 B2 | 11/2010 | Krajewski et al. |
| 7,851,694 B2 | 12/2010 | Anderson et al. |
| 7,851,700 B2 | 12/2010 | Luch |
| 7,868,249 B2 | 1/2011 | Luch |
| 7,897,979 B2 | 3/2011 | Yamazaki et al. |
| 7,898,053 B2 | 3/2011 | Luch |
| 7,898,054 B2 | 3/2011 | Luch |
| 7,939,749 B2 | 5/2011 | Ahn et al. |
| 7,943,845 B2 | 5/2011 | Hayes |
| 7,960,643 B2 | 6/2011 | Krajewski et al. |
| 7,989,692 B2 | 8/2011 | Luch |
| 7,989,693 B2 | 8/2011 | Luch |
| 8,030,832 B2 | 10/2011 | Kim et al. |
| 8,076,568 B2 | 12/2011 | Luch |
| 8,110,737 B2 | 2/2012 | Luch |
| 8,138,413 B2 | 3/2012 | Luch |
| 8,148,631 B2 | 4/2012 | Fix |
| 8,168,885 B2 | 5/2012 | Hayes et al. |
| 2001/0050102 A1 | 12/2001 | Matsumi et al. |
| 2001/0054435 A1 | 12/2001 | Nagao et al. |
| 2002/0062828 A1 | 5/2002 | Nydahl et al. |
| 2002/0078991 A1 | 6/2002 | Nagao et al. |
| 2002/0134421 A1 | 9/2002 | Nagao et al. |
| 2002/0164834 A1 | 11/2002 | Boutros et al. |
| 2003/0000568 A1 | 1/2003 | Gonsiorawski |
| 2003/0079772 A1 | 5/2003 | Gittings et al. |
| 2003/0172922 A1 | 9/2003 | Haber |
| 2003/0205270 A1 | 11/2003 | Stanberry |
| 2004/0016456 A1 | 1/2004 | Murozono et al. |
| 2004/0090380 A1 | 5/2004 | Luch |
| 2004/0112426 A1 | 6/2004 | Hagino |
| 2004/0187911 A1 | 9/2004 | Gaudiana et al. |
| 2005/0061363 A1 | 3/2005 | Ginley et al. |
| 2005/0067007 A1 | 3/2005 | Toft |
| 2005/0072461 A1 | 4/2005 | Kuchinski et al. |
| 2005/0087225 A1 | 4/2005 | Morooka et al. |
| 2005/0115603 A1 | 6/2005 | Yoshida et al. |
| 2005/0121067 A1 | 6/2005 | Toyomura et al. |
| 2005/0126621 A1 | 6/2005 | Dinwoodie et al. |
| 2005/0172995 A1 | 8/2005 | Rohrig et al. |
| 2005/0172996 A1 | 8/2005 | Hacke et al. |
| 2005/0176270 A1 | 8/2005 | Luch |
| 2005/0217719 A1 | 10/2005 | Mahieu et al. |
| 2005/0274408 A1* | 12/2005 | Li et al. .................. 136/244 |
| 2006/0032752 A1 | 2/2006 | Luch |
| 2006/0042681 A1 | 3/2006 | Korman |
| 2006/0086382 A1 | 4/2006 | Plaisted |
| 2006/0121748 A1 | 6/2006 | Brieko |
| 2006/0130891 A1 | 6/2006 | Carlson |
| 2006/0174930 A1 | 8/2006 | Murphy et al. |
| 2007/0095386 A1 | 5/2007 | Gibson |
| 2007/0102038 A1 | 5/2007 | Kirschining |
| 2007/0137692 A1 | 6/2007 | Carlson |
| 2007/0144576 A1 | 6/2007 | Crabtree et al. |
| 2007/0144577 A1 | 6/2007 | Rubin |
| 2007/0169336 A1 | 7/2007 | Luc |
| 2007/0182641 A1 | 8/2007 | Luch |
| 2007/0227574 A1 | 10/2007 | Cart |
| 2007/0256723 A1 | 11/2007 | Oak |
| 2007/0283996 A1 | 12/2007 | Hachtmann et al. |
| 2007/0283997 A1 | 12/2007 | Hachtmann et al. |
| 2007/0295385 A1 | 12/2007 | Sheats |
| 2007/0295388 A1 | 12/2007 | Adriani et al. |
| 2007/0295390 A1 | 12/2007 | Sheats |
| 2008/0000518 A1 | 1/2008 | Basol |

(56) References Cited

U.S. PATENT DOCUMENTS

| | | |
|---|---|---|
| 2008/0011350 A1 | 1/2008 | Luch |
| 2008/0023069 A1 | 1/2008 | Terada et al. |
| 2008/0035198 A1 | 2/2008 | Teppe et al. |
| 2008/0041434 A1 | 2/2008 | Adriani et al. |
| 2008/0041442 A1 | 2/2008 | Hanoka |
| 2008/0053512 A1 | 3/2008 | Kawashima |
| 2008/0053519 A1 | 3/2008 | Pearce |
| 2008/0072951 A1 | 3/2008 | Gabor |
| 2008/0078437 A1 | 4/2008 | Hammond |
| 2008/0092944 A1 | 4/2008 | Rubin |
| 2008/0128018 A1 | 6/2008 | Hayes |
| 2008/0142071 A1 | 6/2008 | Dorn et al. |
| 2008/0196760 A1 | 8/2008 | Hayes et al. |
| 2008/0202577 A1 | 8/2008 | Hieslmair |
| 2008/0210287 A1 | 9/2008 | Volpp et al. |
| 2008/0257399 A1 | 10/2008 | Wong et al. |
| 2008/0264471 A1 | 10/2008 | Hayes |
| 2008/0289681 A1 | 11/2008 | Adriani et al. |
| 2008/0289682 A1 | 11/2008 | Adriani et al. |
| 2008/0302418 A1 | 12/2008 | Buller et al. |
| 2008/0314432 A1 | 12/2008 | Paulson et al. |
| 2008/0314433 A1 | 12/2008 | Luch |
| 2009/0014049 A1 | 1/2009 | Gur et al. |
| 2009/0014057 A1 | 1/2009 | Croft et al. |
| 2009/0107538 A1 | 4/2009 | Luch |
| 2009/0111206 A1 | 4/2009 | Luch |
| 2009/0114261 A1 | 5/2009 | Stancel et al. |
| 2009/0159119 A1 | 6/2009 | Basol |
| 2009/0169722 A1 | 7/2009 | Luch |
| 2009/0173374 A1 | 7/2009 | Luch |
| 2009/0173384 A1 | 7/2009 | Ooi et al. |
| 2009/0199894 A1 | 8/2009 | Hollars et al. |
| 2009/0205705 A1 | 8/2009 | Brendel et al. |
| 2009/0211628 A1 | 8/2009 | Engelhart et al. |
| 2009/0235979 A1 | 9/2009 | Wudu et al. |
| 2009/0255565 A1 | 10/2009 | Britt et al. |
| 2009/0272436 A1 | 11/2009 | Cheung |
| 2009/0293941 A1 | 12/2009 | Luch |
| 2009/0308430 A1 | 12/2009 | Everett et al. |
| 2009/0314330 A1 | 12/2009 | Saha et al. |
| 2010/0018135 A1 | 1/2010 | Croft et al. |
| 2010/0043863 A1 | 2/2010 | Wudu et al. |
| 2010/0108118 A1 | 5/2010 | Luch |
| 2010/0108141 A1 | 5/2010 | Fukushima et al. |
| 2010/0116310 A1 | 5/2010 | Shimizu et al. |
| 2010/0193367 A1 | 8/2010 | Luch |
| 2010/0258185 A1 | 10/2010 | Meyer et al. |
| 2011/0067754 A1 | 3/2011 | Luch |
| 2011/0108087 A1 | 5/2011 | Croft et al. |
| 2011/0197947 A1 | 8/2011 | Croft |
| 2011/0300661 A1 | 12/2011 | Pearce et al. |
| 2011/0308563 A1 | 12/2011 | Shufflebotham |
| 2011/0315206 A1 | 12/2011 | Krajewski et al. |
| 2011/0315208 A1 | 12/2011 | Krajewski et al. |
| 2012/0024341 A1 | 2/2012 | Luch |
| 2012/0024358 A1 | 2/2012 | Luch |
| 2012/0031461 A1 | 2/2012 | Luch |
| 2012/0031462 A1 | 2/2012 | Luch |
| 2012/0080079 A1 | 4/2012 | Corneille et al. |
| 2012/0103383 A1 | 5/2012 | Shufflebotham |
| 2012/0125393 A1 | 5/2012 | Austin |
| 2012/0138117 A1 | 6/2012 | Krajewski |
| 2012/0171802 A1 | 7/2012 | Luch |
| 2012/0174967 A1 | 7/2012 | Pearce et al. |
| 2012/0240982 A1 | 9/2012 | Corneille |
| 2012/0322194 A1 | 12/2012 | Luch |

* cited by examiner

COLLECTOR GRID AND INTERCONNECT STRUCTURES FOR PHOTOVOLTAIC ARRAYS AND MODULES

CROSS-REFERENCE TO RELATED APPLICATIONS

This application is a Continuation-in-Part of U.S. patent application Ser. No. 13/385,207 filed Feb. 6, 2012 entitled Collector Grid and Interconnect Structures for Photovoltaic Arrays and Modules, which is a Continuation-in-Part of U.S. patent application Ser. No. 12/803,490 filed Jun. 29, 2010 entitled Collector Grid and Interconnect Structures for Photovoltaic Arrays and Modules, and now U.S. Pat. No. 8,138,413, which is a Continuation-in-Part of U.S. patent application Ser. No. 12/798,221 filed Mar. 31, 2010 entitled Collector Grid and Interconnect Structures for Photovoltaic Arrays and Modules, and now U.S. Pat. No. 8,076,568, which is a Continuation-in-Part of U.S. patent application Ser. No. 11/980,010 filed Oct. 29, 2007 entitled Collector Grid and Interconnect Structures for Photovoltaic Arrays and Modules, now abandoned.

This application is a Continuation-in-Part of U.S. patent application Ser. No. 13/385,207 filed Feb. 6, 2012 entitled Collector Grid and Interconnect Structures for Photovoltaic Arrays and Modules, which also is a Continuation-in-Part of U.S. patent application Ser. No. 13/317,117 filed Oct. 11, 2011, entitled Collector Grid, Electrode Structures and Interconnect Structures for Photovoltaic Arrays and Methods of Manufacture, and now U.S. Pat. No. 8,222,513, which is a Continuation-in-Part of U.S. patent application Ser. No. 13/199,333 filed Aug. 25, 2011, entitled Collector Grid, Electrode Structures and Interconnect Structures for Photovoltaic Arrays and Methods of Manufacture, and now U.S. Pat. No. 8,110,737, which is a Continuation of U.S. patent application Ser. No. 12/290,896 filed Nov. 5, 2008, entitled Collector Grid, Electrode Structures and Interconnect Structures for Photovoltaic Arrays and Methods of Manufacture, now abandoned, which is a Continuation-in-Part of U.S. patent application Ser. No. 11/824,047 filed Jun. 30, 2007, entitled Collector Grid, Electrode Structures and Interconnect Structures for Photovoltaic Arrays and other Optoelectric Devices, now abandoned, which is a Continuation-in-Part of U.S. application Ser. No. 11/404,168 filed Apr. 13, 2006, entitled Substrate and Collector Grid Structures for Integrated Photovoltaic Arrays and Process of Manufacture of Such Arrays and now U.S. Pat. No. 7,635,810.

This application is a Continuation-in-Part of U.S. patent application Ser. No. 13/385,207 filed Feb. 6, 2012 entitled Collector Grid and Interconnect Structures for Photovoltaic Arrays and Modules, which is a Continuation-in-Part of U.S. patent application Ser. No. 12/590,222 filed Nov. 3, 2009 entitled Photovoltaic Power Farm Structure and Installation, which is a Continuation-in-Part of U.S. patent application Ser. No. 12/156,505 filed Jun. 2, 2008 entitled Photovoltaic Power Farm Structure and Installation, now abandoned.

This application also claims priority to U.S. Provisional Patent Application No. 61/274,960 filed Aug. 24, 2009 entitled Identification, Isolation, and Repair of Shunts and Shorts in Photovoltaic Cells.

The instant application claims the benefit of priority from all of the above applications.

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. Material requirements are minimized and technologies can be proposed for mass production. The thin film structures can be designed according to doped homojunction technology such as that involving silicon films, or can employ heterojunction approaches such as those using CdTe or chalcopyrite materials. Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769,086 to Swartz, Turner et al. and Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

It has become well known in the art that the efficiencies of certain promising thin film photovoltaic junctions can be substantially increased by high temperature treatments. These treatments involve temperatures at which even the most heat resistant polymers suffer rapid deterioration, thereby requiring either ceramic, glass, or metal substrates to support the thin film junctions. Use of a glass or ceramic substrates generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,746,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for an inexpensive manufacturing process which allows high heat treatment for thin film photovoltaic junctions while also offering unique means to achieve effective integrated series connections.

A further unsolved problem which has thwarted production of expansive surface photovoltaic modules is that of collecting the photogenerated current from the top, light incident surface. Transparent conductive oxide (TCO) layers have been employed as a top surface electrode. However, these TCO layers are relatively resistive compared to pure metals. This fact forces individual cell widths to be reduced in order to prevent unacceptable resistive power losses. As cell widths decrease, the width of the area between individual cells (interconnect area) should also decrease so that the relative portion of inactive surface of the interconnect area does not become excessive. Typical cell widths of one centimeter are often taught in the art. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode. The problem of collecting photovoltaic generated current from the top light impinging surface of a photovoltaic cell has been addressed in a number of ways, none entirely successful.

In a somewhat removed segment of technology, a number of electrically conductive fillers have been used to produce electrically conductive polymeric materials. This technology generally involves mixing of the conductive filler into the polymer resin prior to fabrication of the material into its final shape. Conductive fillers typically consist of high aspect ratio particles such as metal fibers, metal flakes, or highly structured carbon blacks, with the choice based on a number of cost/performance considerations. Electrically conductive resins have been used as bulk thermoplastic compositions, or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction (typically referred to as "electroless plating"). This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. Finally, the sensitivity of ABS plastic to liquid hydrocarbons has prevented certain applications. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

A number of attempts have been made to simplify the electroplating of plastics. If successful such efforts could result in significant cost reductions for electroplated plastics and could allow facile continuous electroplating of plastics to be practically employed, thus permitting new applications. Some simplification attempts involve special chemical techniques, other than conventional electroless metal deposition, to produce an electrically conductive film on the surface. Typical examples of the approach are taught by U.S. Pat. No. 3,523,875 to Minklei, U.S. Pat. No. 3,682,786 to Brown et al., and U.S. Pat. No. 3,619,382 to Lupinski. The electrically conductive surface film produced was intended to be electroplated. Multiple performance problems thwarted these attempts.

Other approaches contemplate making the plastic surface itself conductive enough to allow it to be electroplated directly thereby avoiding the "electroless plating" or lamination processes. Efforts have been made to advance systems contemplating metal electrodeposition directly onto the surface of polymers made conductive through incorporating conductive fillers. When considering polymers rendered electrically conductive by loading with electrically conductive fillers, it may be important to distinguish between "microscopic resistivity" and "bulk" or macroscopic resistivity". "Microscopic resistivity" refers to a characteristic of a polymer/filler mix considered at a relatively small linear dimension of for example 1 micrometer or less. "Bulk" or "macroscopic resistivity" refers to a characteristic determined over larger linear dimensions. To illustrate the difference between "microscopic" and "bulk, macroscopic" resistivities, one can consider a polymer loaded with conductive fibers at a fiber loading of 10 weight percent. Such a material might show a low "bulk, macroscopic" resistivity when the measurement is made over a relatively large distance. However, because of fiber separation (holes) such a composite might not exhibit consistent "microscopic" resistivity. When producing an electrically conductive polymer intended to be electroplated, one should consider "microscopic resistivity" in order to achieve uniform, "hole-free" deposit coverage. Thus, it may be advantageous to consider conductive fillers comprising those that are relatively small, but with loadings sufficient to supply the required conductive contacting. Such fillers include metal powders and flake, metal coated mica or spheres, conductive carbon black, conductive nanoparticle materials, subdivided conductive polymers and the like.

Efforts to produce electrically conductive polymers suitable for direct electroplating have encountered a number of obstacles. The first is the combination of fabrication difficulty and material property deterioration brought about by the heavy filler loadings often required. A second is the high cost of many conductive fillers employed such as silver flake.

Another obstacle involved in the electroplating of electrically conductive polymers is a consideration of adhesion between the electrodeposited metal and polymeric substrate (metal/polymer adhesion). In some cases such as electroforming, where the electrodeposited metal is eventually removed from the substrate, metal/polymer adhesion may actually be detrimental. However, in most cases sufficient adhesion is required to prevent metal/polymer separation during extended environmental and use cycles.

A number of methods to enhance adhesion have been employed. For example, etching of the surface prior to plating can be considered. Etching can often be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids.

In the case of conductive polymers containing finely divided metal, one can propose achieving direct metal-to-metal adhesion between electrodeposit and filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

An additional major obstacle confronting development of electrically conductive polymeric resin compositions capable of being directly electroplated is the initial "bridge" of electrodeposit on the surface of the electrically conductive resin. In electrodeposition, the substrate to be plated is often made cathodic through a pressure contact to a metal contact tip, itself under cathodic potential. However, if the contact resistance is excessive or the substrate is insufficiently conductive, the electrodeposit current favors the metal contact and the electrodeposit may have difficulty bridging to the substrate. The "bridging" problem extends to substrates having low surface current carrying capacity such as vacuum metallized or electrolessly plated films. In some cases, "burning" or actual "deplating" of very thin metal deposits can be experienced during the initial moments of "bridge" formation.

Moreover, a further problem is encountered even if specialized racking or contacting successfully achieves electrodeposit bridging to the substrate. Many of the electrically conductive polymeric resins have resistivities far higher than those of typical metal substrates. Also in many cases, such as the electroplating of conductive ink patterns or thin metal films, the conductive material may be relatively thin. The initial conductive substrate can be relatively limited in the amount of electrodeposition current which it alone can convey. In these cases the initial conductive substrate may not cover almost instantly with electrodeposit as is typical with thicker metallic substrates. Rather the electrodeposit coverage may result from lateral growth over the surface, with a significant portion of the electrodeposition current, including that associated with the lateral electrodeposit growth, passing through the previously electrodeposited metal. This restricts the size and "growth length" of the substrate conductive pattern, increases plating costs, and can also result in large non-uniformities in electrodeposit integrity and thickness over the pattern.

Rates of this lateral growth likely depend on the ability of the substrate to convey current. Thus, the thickness and resistivity of the initial conductive substrate can be defining factors in the ability to achieve satisfactory electrodeposit coverage rates. When dealing with extended electroplated patterns, long narrow metal traces are often desired, deposited on relatively thin initial conductive substrates such as printed inks. These factors of course work against achieving the desired result.

This coverage rate problem likely can be characterized by a continuum, being dependent on many factors such as the nature of the initially electrodeposited metal, applied voltage, electroplating bath chemistry, the nature of the polymeric binder and the resistivity of the electrically conductive polymeric substrate. As a "rule of thumb", the instant inventor estimates that coverage rate problems would demand attention if the resistivity of the conductive polymeric substrate rose above about 0.001 ohm-cm. Alternatively, electrical current carrying capacity of thin films is often reported as a surface resistivity in "ohms per square". Using this measure, the inventor estimates that coverage rate issues may demand attention should the surface resistivity rise above about 0.01 ohms per square.

Beset with the problems of achieving adhesion and satisfactory electrodeposit coverage rates, investigators have attempted to produce directly electroplateable polymers by heavily loading polymers with relatively small conductive filler particles. Fillers include finely divided metal powders and flake, conductive metal oxides and intrinsically conductive polymers. Heavy loadings may be sufficient to reduce both microscopic and macroscopic resistivity to levels where the coverage rate phenomenon may be manageable. However, attempts to make an acceptable directly electroplateable resin using the relatively small fillers alone encounter a number of barriers. First, the fine conductive fillers can be relatively expensive. The loadings required to achieve the particle-to-particle proximity to achieve acceptable conductivity increases the cost of the polymer/filler blend dramatically. The fine fillers may bring further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding, printing, etc.). A required heavy loading of filler severely restricts ability to manipulate processing properties in this way. A further problem is that metal fillers can be abrasive to processing machinery and may require specialized screws, barrels, and the like. Finally, despite being electrically conductive, a polymer filled with conductive particles still offers no mechanism to produce adhesion of an electrodeposit since the particles may be essentially encapsulated by the resin binder, often resulting in a non-conductive or non-binding resin-rich "skin".

For the above reasons, fine conductive particle containing plastics have not been widely used as bulk substrates for directly electroplateable articles. Rather, they have found applications in production of conductive adhesives, pastes, and inks. Recent activity has been reported wherein polymer inks heavily loaded with silver particles have been proposed as a "seed layer" upon which subsequent electrodeposition of metal is achieved. However, high material costs, application complexity, electrodeposit growth rate issues and adhesion remain with these approaches. In addition, it has been reported that these films are typically deposited at a thickness of approximately 3 microns resulting in a surface resistance of approximately 0.15 ohms per square. Such low current carrying capacity films likely would experience the electroplating problems discussed above.

The least expensive (and least conductive) of the readily available conductive fillers for plastics are carbon blacks. Typically the resistivity of a conductive polymer is not reduced below approximately 1 ohm-cm using carbon black alone. Thus in a thin film form at a thickness of 5 microns a surface resistivity would typically be approximately 2,000 ohms per square. Attempts have been made to produce electrically conductive polymers based on carbon black loading intended to be subsequently electroplated. Examples of this approach are the teachings of U.S. Pat. Nos. 4,038,042, 3,865,699, and 4,278,510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. However, the rates of electrodeposit coverage reported by Adelman may be insufficient for many applications.

Luch in U.S. Pat. No. 3,865,699 and Chien et al. in U.S. Pat. No. 4,278,510 also chose carbon black as a filler to provide an electrically conductive surface for the polymeric compounds to be electroplated. The Luch U.S. Pat. No. 3,865,699 and the Chien U.S. Pat. No. 4,278,510 are hereby incorporated in their entirety by this reference. However, these inventors further taught inclusion of an electrodeposit coverage or growth rate accelerator to overcome the galvanic bridging and lateral electrodeposit growth rate problems described above. An electrodeposit coverage rate accelerator is an additive functioning to increase the electrodeposition coverage rate over and above any affect it may have on the conductivity of an electrically conductive polymer. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome those problems associated with electrically conductive polymeric substrates having relatively high resistivity.

In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These DER materials can be generally described as electrically conductive polymers characterized by having an electrically conductive surface with the inclusion of an electrodeposit coverage rate accelerator. In the following, the acronym "DER" will be used to designate a directly electroplateable resin as defined in this specification.

Specifically for the present invention, directly electroplateable resins, (DER), are characterized by the following features.

(a) presence of an electrically conductive polymer characterized by having an electrically conductive surface;
(b) presence of an electrodeposit coverage rate accelerator;
(c) presence of the electrically conductive polymer characterized by having an electrically conductive surface and the electrodeposit coverage rate accelerator in the directly electroplateable composition in cooperative amounts required to achieve direct coverage of the composition with an electrodeposited metal or metal-based alloy.

In his patents, Luch specifically identified elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

In his patents, Luch identified carbon black as a means to render a polymer and its surface electrically conductive. As is known in the art, other conductive fillers can be used to impart conductivity to a polymer. These include metallic flakes or powders such as those comprising nickel or silver. Other fillers such as metal coated minerals and certain metal oxides may also suffice. Furthermore, one might expect that compositions comprising intrinsically conductive polymers may be suitable.

Regarding electrodeposit coverage rate accelerators, both Luch and Chien et al. in the above discussed U.S. patents demonstrated that sulfur and other sulfur bearing materials such as sulfur donors and accelerators served this purpose when using an initial Group VIII "strike" layer. One might expect that other elements of Group 6A nonmetals, such as oxygen, selenium and tellurium, could function in a way similar to sulfur. In addition, other combinations of electrodeposited metals and nonmetal coverage rate accelerators may be identified. Finally, the electrodeposit coverage rate accelerator may not necessarily be a discrete material entity. For example, the coverage rate accelerator may consist of a functional species appended to the polymeric binder chain or a species adsorbed onto the surface of the conductive filler. It is important to recognize that such an electrodeposit coverage rate accelerator can be extremely important in order to achieve direct electrodeposition in a practical way onto polymeric substrates having low conductivity or very thin electrically conductive polymeric substrates having restricted current carrying ability.

As pointed out above in this specification, attempts to dramatically simplify the process of electroplating on plastics have met with commercial difficulties. Nevertheless, the current inventor has persisted in personal efforts to overcome certain performance deficiencies associated with electroplating onto material structures having low current carrying ability, conductive plastics and DER's. Along with these efforts has come a recognition of unique and eminently suitable applications for electrically conductive polymers and often more specifically the DER technology. Some examples of these unique applications for electroplated items include solar cell electrical current collection grids and interconnect structures, electrical circuits, electrical traces, circuit boards, antennas, capacitors, induction heaters, connectors, switches, resistors, inductors, batteries, fuel cells, coils, signal lines, power lines, radiation reflectors, coolers, diodes, transistors, piezoelectric elements, photovoltaic cells, emi shields, biosensors and sensors. One readily recognizes that the demand for such functional applications for electroplated articles is relatively recent and has been particularly explosive during the past decade.

Regarding the DER technology, a first recognition is that the "microscopic" material resistivity generally is not reduced below about 1 ohm-cm. by using conductive carbon black alone. This is several orders of magnitude larger than typical metal resistivities. Other well known finely divided conductive fillers (such as metal flake or powder, metal coated minerals, graphite, or other forms of conductive carbon) can be considered in DER applications requiring lower "microscopic" resistivity. In these cases the more highly conductive fillers can be considered to augment or even replace the conductive carbon black.

Moreover, the "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications such as achieving higher current carrying capacity for a buss. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer. This is an important recognition regarding DER's in that electrodeposit coverage speed depends on the presence of an electrodeposit coverage rate accelerator and on the "microscopic resistivity" and less so on the "macroscopic resistivity" of the DER formulation. Thus, large additional loadings of functional non-conductive fillers can be tolerated in DER formulations without undue sacrifice in electrodeposit coverage rates or adhesion. These additional non-conductive loadings do not greatly affect the "microscopic resistivity" associated with the polymer/conductive filler/electrodeposit coverage rate accelerator "matrix" since the non-conductive filler is essentially encapsulated by "matrix" material. Conventional "electroless" plating technology does not permit this compositional flexibility.

Yet another recognition regarding the DER technology is its ability to employ polymer resins and formulations generally chosen in recognition of the fabrication process envisioned and the intended end use requirements. In order to provide clarity, examples of some such fabrication processes are presented immediately below in subparagraphs 1 through 6.

(1) Should it be desired to electroplate an ink, paint, coating, or paste which may be printed or formed on a substrate, a good film forming polymer, for example a soluble resin such as an elastomer, can be chosen to fabricate a DER ink (paint, coating, paste etc.). The DER ink composition can be tailored for a specific process such flexographic printing, rotary silk screening, gravure printing, flow coating, spraying etc. Furthermore, additives can be employed to improve the adhesion of the DER ink to various substrates. One example would be tackifiers.

(2) Should it be desired to electroplate a fabric, a DER ink can be used to coat all or a portion of the fabric intended to be electroplated. Furthermore, since DER's can be fabricated out of the thermoplastic materials commonly used to create fabrics, the fabric itself could completely or partially comprise a DER. This would eliminate the need to coat the fabric.

(3) Should one desire to electroplate a thermoformed article or structure, DER's would represent an eminently suitable material choice. DER's can be easily formulated using olefinic materials which are often a preferred material for the thermoforming process. Furthermore, DER's can be easily and inexpensively extruded into the sheet like structure necessary for the thermoforming process.

(4) Should one desire to electroplate an extruded article or structure, for example a sheet or film, DER's can be formulated to possess the necessary melt strength advantageous for the extrusion process.

(5) Should one desire to injection mold an article or structure having thin walls, broad surface areas etc. a DER composition comprising a high flow polymer can be chosen.

(6) Should one desire to vary adhesion between an electrodeposited DER structure supported by a substrate the DER material can be formulated to supply the required adhesive characteristics to the substrate. For example, the polymer chosen to fabricate a DER ink can be chosen to cooperate with an "ink adhesion promoting" surface treatment such as a material primer or corona treatment. In this regard, it has been observed that it may be advantageous to limit such adhesion promoting treatments to a single side of the substrate. Treatment of both sides of the substrate in a roll to roll process may adversely affect the surface of the DER material and may lead to deterioration in plateability. For example, it has been observed that primers on both sides of a roll of PET film have adversely affected plateability of DER inks printed on the PET. It is believed that this is due to primer being transferred to the surface of the DER ink when the PET is rolled up.

All polymer fabrication processes require specific resin processing characteristics for success. The ability to "custom formulate" DER's to comply with these changing processing and end use requirements while still allowing facile, quality electroplating is a significant factor in the teachings of the current invention. Conventional plastic electroplating technology does not permit great flexibility to "custom formulate".

Another important recognition regarding the suitability of DER's for the teachings of the current invention is the simplicity of the electroplating process. Unlike many conventional electroplated plastics, DER's do not require a significant number of process steps during the manufacturing process. This allows for simplified manufacturing and improved process control. It also reduces the risk of cross contamination such as solution dragout from one process bath being transported to another process bath. The simplified manufacturing process will also result in reduced manufacturing costs.

Yet another recognition of the benefit of DER's for the teachings of the current invention is the ability they offer to selectively electroplate an article or structure. As will be shown in later embodiments, it is often desired to electroplate a polymer or polymer-based structure in a selective manner. DER's are eminently suitable for such selective electroplating.

Yet another recognition of the benefit of DER's for the teachings of the current invention is their ability to withstand the pre-treatments often required to prepare other materials for plating. For example, were a DER to be combined with a metal, the DER material would be resistant to many of the pre-treatments such as cleaning which may be necessary to electroplate the metal.

Yet another recognition of the benefit of DER's for the teachings of the current invention is that the desired plated structure often requires the plating of long and/or broad surface areas. As discussed previously, the coverage rate accelerators included in DER formulations allow for such extended surfaces to be covered in a relatively rapid manner thus allowing one to consider the use of electroplating of conductive polymers.

These and other attributes of DER's in the practice of the instant invention will become clear through the following remaining specification, accompanying figures and claims.

In order to eliminate ambiguity in terminology, for the present invention the following definitions are supplied:

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

"Electroplateable material" refers to a material that exhibits a surface that can be exposed to an electroplating process to cause the surface to cover with electrodeposited material.

OBJECTS OF THE INVENTION

An object of the invention is to eliminate the deficiencies in the prior art methods of producing expansive area, series interconnected photovoltaic arrays.

A further object of the present invention is to provide improved processes whereby expansive area, interconnected photovoltaic arrays can be economically mass produced.

A further object of the invention is to provide improved processes and structures for supplying current collector grids and interconnection structures.

Other objects and advantages will become apparent in light of the following description taken in conjunction with the drawings and embodiments.

SUMMARY OF THE INVENTION

The current invention provides a solution to the stated need by producing the active photovoltaic film and interconnecting structure separately and subsequently combining them to produce the desired expansive interconnected array.

In one embodiment, the interconnect structure is laminated to the light incident surface of a photovoltaic cell. If desired the separately prepared interconnection structure allows the photovoltaic junction to be produced in bulk. Furthermore, the junction can be produced with a wide variety of photovoltaic materials including but not limited to, single crystal silicon, polycrystalline silicon, amorphous silicon, CIS, CIGS, cadmium telluride, copper sulfide, semiconductor inks, polymer based semiconductor inks etc.

DESCRIPTION OF PREFERRED EMBODIMENTS

Figure 1:
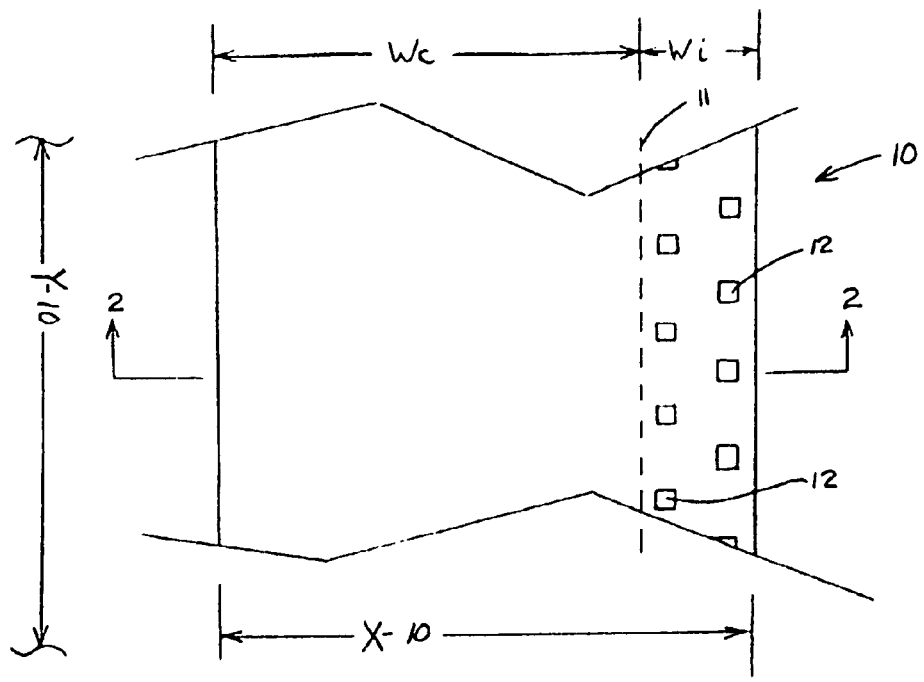
FIG. 1 is a top plan view of a structure forming a starting article for an embodiment of the invention.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
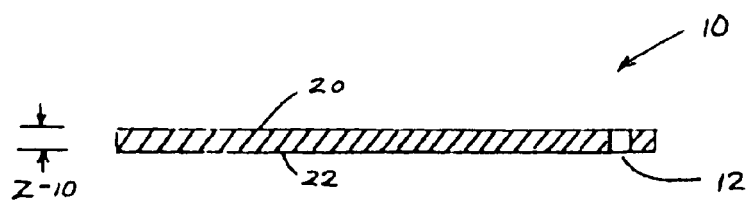
FIG. 2 is a sectional view taken substantially from the perspective of lines 2-2 of FIG. 1.
Figure 3:
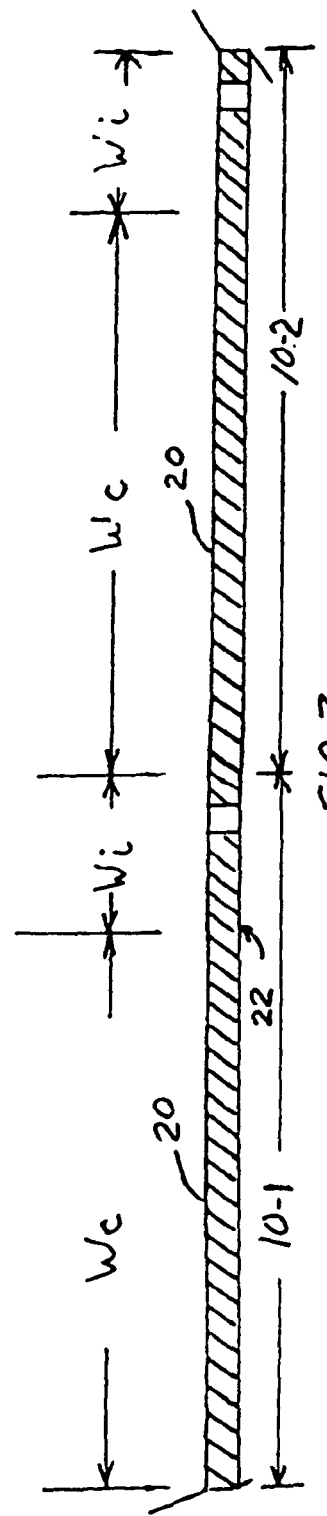
FIG. 3 is a sectional view showing another embodiment of the basic structure depicted in FIG. 2.

Referring now to FIGS. 1 through 3, there are shown embodiments of a starting structure for a grid/interconnect article of the invention. FIG. 1 is a top plan view of a polymeric film or glass article generally identified by numeral 10. Article 10 has width X-10 and length Y-10. Length Y-10 is sometimes much greater the width X-10 such that article 10 can be processed in essentially a "roll-to-roll" fashion. However, this is not necessarily the case. Dimension "Y" can be chosen according to the application and process envisioned. FIG. 2 is a sectional view taken substantially from the perspective of lines 2-2 of FIG. 1. Thickness dimension Z-10 is normally small in comparison to dimensions Y-10 and X-10 and thus article 10 has a sheetlike structure. Article 10 is further characterized by having regions of essentially solid structure combined with regions having holes 12 extending through the thickness Z-10. In the FIG. 1 embodiment, a substantially solid region is generally defined by a width Wc, representing a current collection region. The region with through-holes (holey region) is generally defined by width Wi, representing an interconnection region. Imaginary line 11 separates the two regions. The reason for these distinctions and definitions will become clear in light of the following teachings.

Figure 1A:
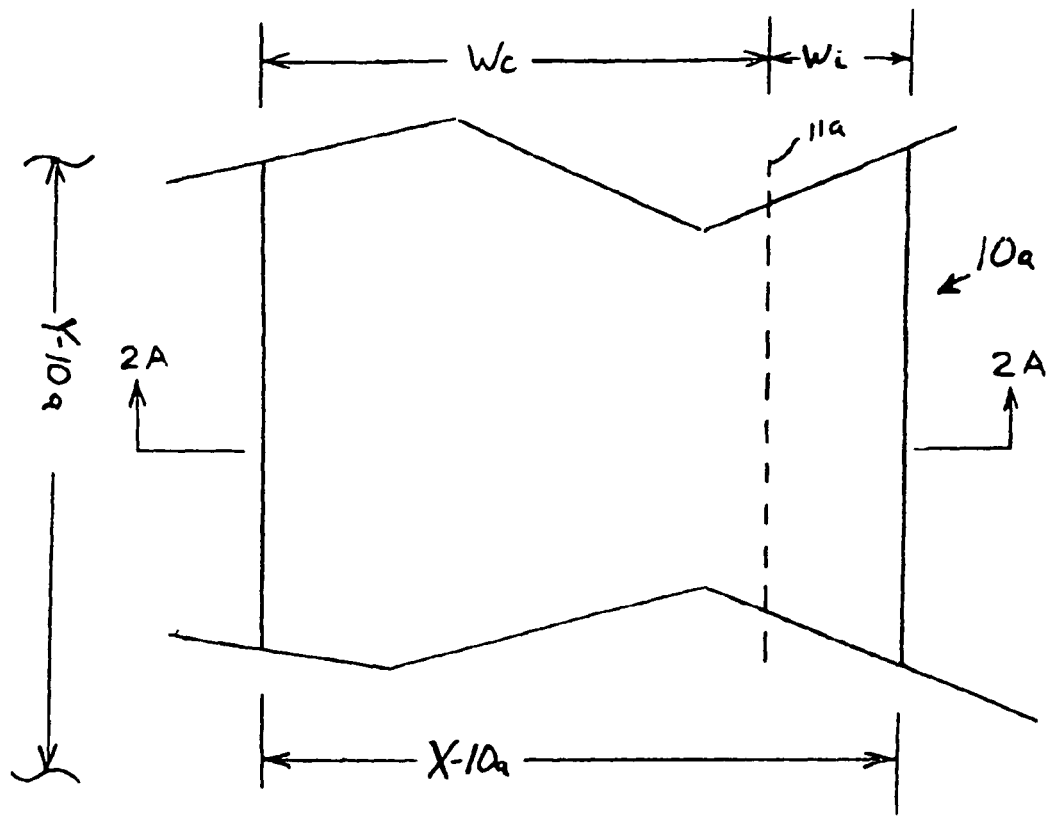
FIG. 1A is a top plan view of another embodiment of a starting article of the invention.
Figure 2A:
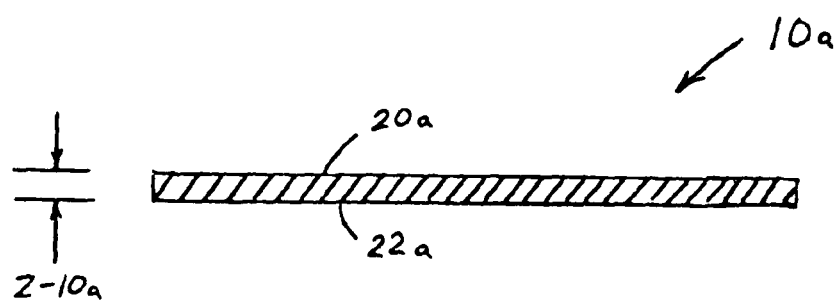
FIG. 2A is a sectional view taken substantially from the perspective of lines 2A-2A of FIG. 1A.

FIGS. 1A and 2A is another embodiment of a sheetlike structure similar to that embodied in FIGS. 1 and 2 but absent the through holes present in the interconnection region Wi of the embodiment of FIGS. 1 and 2.

The instant invention will be taught using the structure embodied in FIGS. 1 and 2. However, one skilled in the art will readily recognize application of the teachings to the structure embodied in FIGS. 1A and 2A and other equivalent structures when appropriate.

Figure 2B:
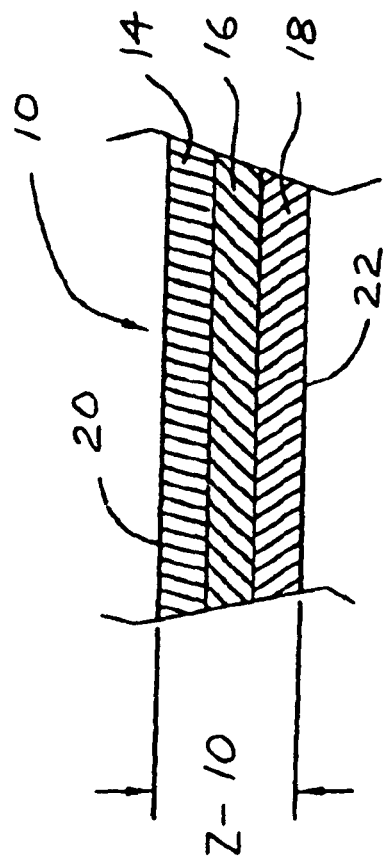
FIG. 2B is a sectional view showing a possible structure of the article of FIGS. 1 and 2 in more detail.

Referring now to FIG. 2, article 10 has a first surface 20 and second surface 22. The sectional view of article 10 shown in FIG. 2 shows a single layer structure. This depiction is suitable for simplicity and clarity of presentation. Often, however, article 10 will be a laminate comprising multiple layers as depicted in FIG. 2B. In the FIG. 2B embodiment, article 10 is seen to comprise multiple layers 14, 16, 18, etc. The multiple layers may comprise inorganic or organic components such as thermoplastics, thermosets, or silicon containing glass-like layers. The various layers are intended to supply functional attributes such as environmental barrier protection or adhesive characteristics. Such functional layering is well known and widely practiced in the plastic food packaging art. In particular, in light of the teachings to follow, one will recognize that it may be advantageous to have layer 14 forming surface 20 comprise a sealing material such as an ethylene vinyl acetate (EVA) containing material for adhesive characteristics during a possible subsequent lamination process. For example, the invention has been successfully demonstrated using a standard laminating material sold by GBC Corp., Northbrook, Ill., 60062. Additional layers 16, 18 etc. may comprise materials which assist in support or processing such as polypropylene and polyethylene terepthalate and barrier materials such as fluorinated polymers.

As depicted in the embodiments of FIGS. 1 and 2, the solid regions Wc and "holey" regions Wi of article 10 comprise the same material. This is not necessarily the case. For example, the "holey" regions Wi of article 10 could comprise a fabric, woven or non-woven, joined to an adjacent substantially solid region along imaginary line 11. However, the materials forming the solid region should be relatively transparent or translucent to visible light, as will be understood in light of the teachings to follow.

FIG. 3 depicts an embodiment wherein multiple widths 10-1, 10-2 etc. of the general structure of FIGS. 1 and 2 are joined together in a generally repetitive pattern in the width direction. As will become clear by the following teachings, such a structure may be advantageous in certain applications of photovoltaic cell interconnection.

Figure 4:
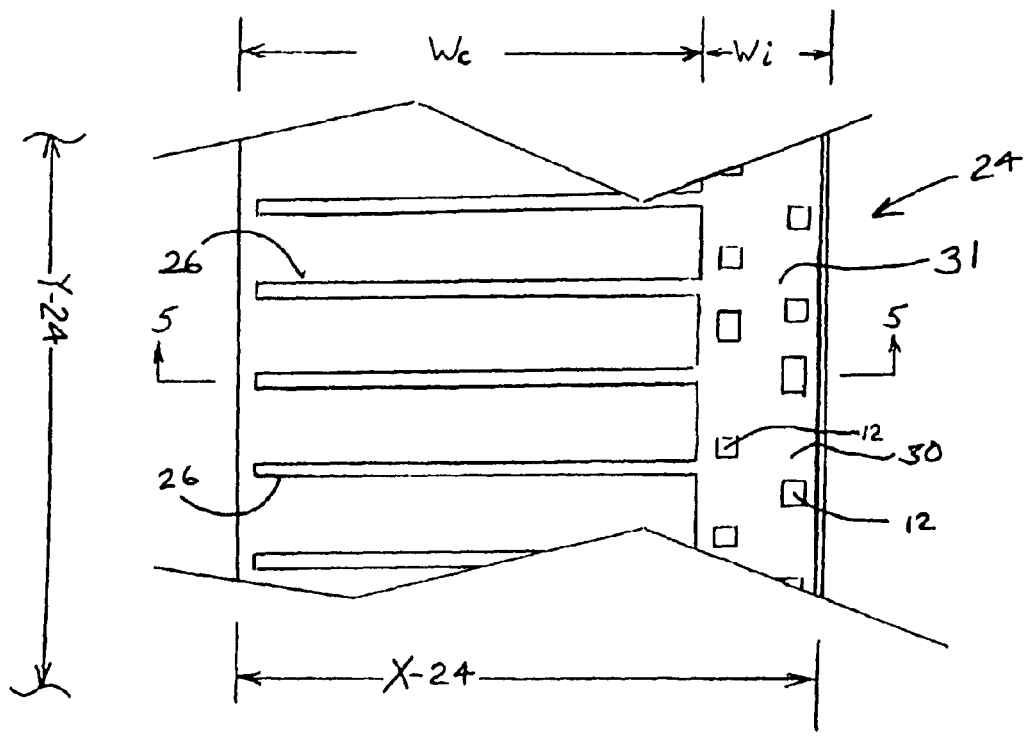
FIG. 4 is a top plan view showing the initial article depicted in FIG. 1 following an additional processing step.
Figure 5:
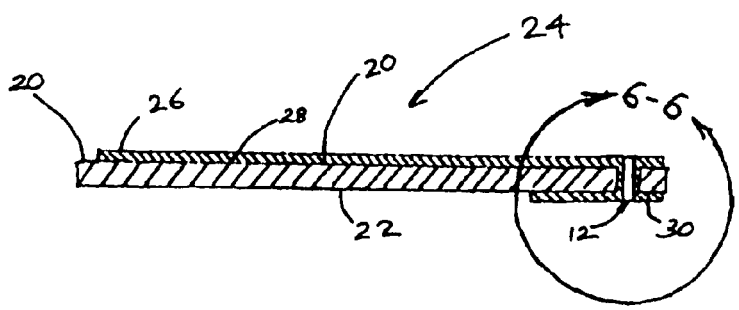
FIG. 5 is a sectional view taken substantially from the perspective of lines 5-5 of FIG. 4.

FIG. 4 is a plan view of the FIG. 1 structure 10 following an additional processing step, and FIG. 5 is a sectional view taken along line 5-5 of FIG. 4. In FIGS. 4 and 5, the article is now designated by the numeral 24 to reflect this additional processing. In FIGS. 4 and 5, it is seen that a pattern of "fingers" 26 has been formed by material 28 positioned in a pattern onto surface 20 of original article 10. "Fingers" 26 extend over the width Wc of the solid sheetlike structure 24. The "fingers" 26 extend to the "holey" interconnection region generally defined by Wi. Portions of the Wc region not overlayed by "fingers" 26 remain transparent or translucent to visible light. The "fingers" may comprise electrically conductive material. Examples of such materials are metal containing inks, patterned deposited metals such as etched metal patterns, intrinsically conductive polymers and DER formulations. The "fingers" may comprise materials intended to facilitate subsequent deposition of conductive material in the pattern defined by the fingers. An example of such a material would be ABS, which can be catalyzed to initiate chemical "electroless" metal deposition. In a preferred embodiment, the "fingers" comprise material which will enhance or allow subsequent metal electrodeposition such as a DER. In the embodiment of FIGS. 4 and 5, the "fingers" are shown to be a single layer for simplicity of presentation. However, the "fingers" can comprise multiple layers of differing materials chosen to support various functional attributes.

Continuing reference to FIGS. 4 and 5 also shows additional material 30 applied to the "holey" region Wi of article 24. As with the material comprising the "fingers" 26, the material 30 applied to the "holey" region Wi is either conductive or material intended to promote subsequent deposition of conductive material. In the embodiment of FIGS. 4 and 5, the "holey" region takes the general form of a "buss" 31 extending in the Y-24 direction in communication with the individual fingers. However, as one will understand through the subsequent teachings, the invention requires only that conductive communication extend from the fingers to a region Wi intended to be electrically joined to the electrode of an adjacent cell. The "holey" region Wi thus does not require overall electrical continuity in the "Y" direction as is characteristic of a "buss" depicted in FIGS. 4 and 5.

Figure 6:
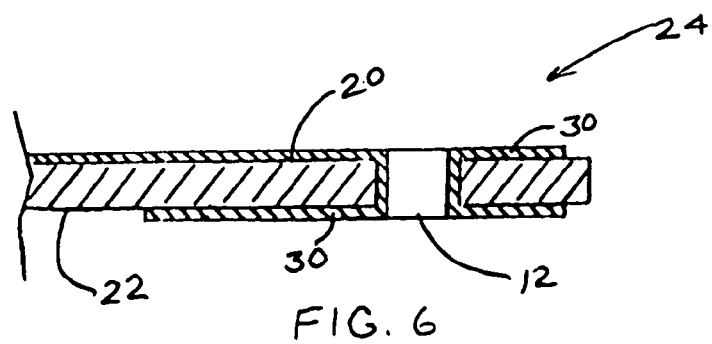
FIG. 6 is an exploded sectional view of the encircled region of FIG. 5 identified as 6-6.

Reference to FIG. 5 shows that the material 30 applied to the "holey" interconnection region Wi is shown as the same as that applied to form the fingers 26. However, these materials 28 and 30 need not be identical. In this embodiment material 30 applied to the "holey" region extends through holes 12 and onto the opposite second surface 22 of article 24. This is best seen in FIG. 6, which is an exploded view of the portion of article 24 encircled by circle 6-6 of FIG. 5. The extension of material 30 through the holes 12 can be readily accomplished as a result of the relatively small thickness (Z dimension) of the sheetlike article. Techniques include two sided printing of conductive inks, through hole deposition of chemically (electroless) deposited metal, through hole deposition of conductive inks and conductive polymers, and through hole electrodeposition.

Figure 7:
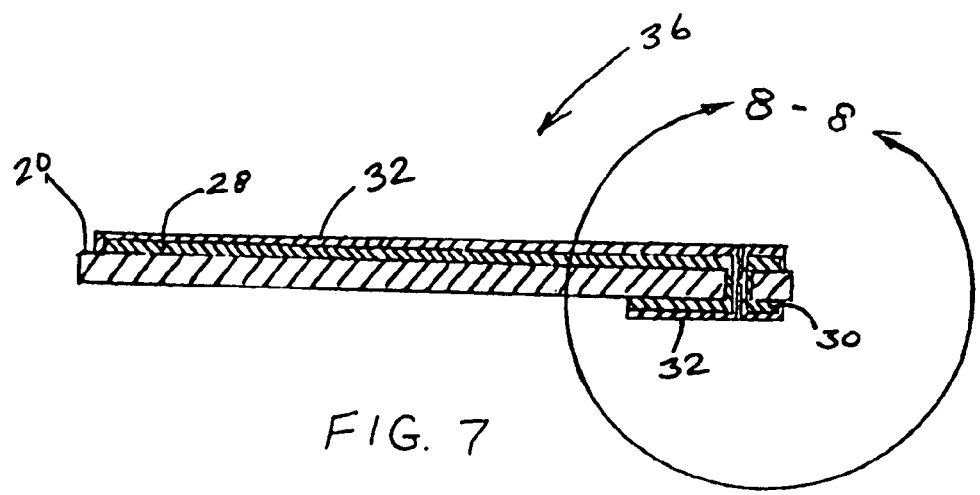
FIG. 7 is a sectional view of the article of FIGS. 4 through 6, taken from a similar perspective of FIG. 5, showing the FIGS. 4 through 6 embodiment following an additional optional processing step.
Figure 8:
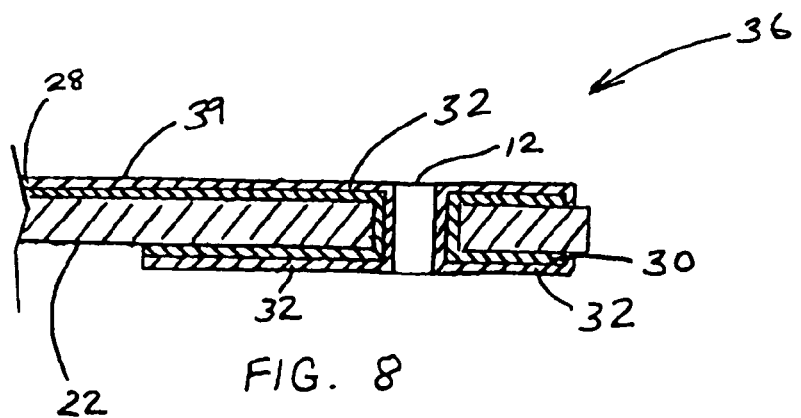
FIG. 8 is an exploded sectional view of the encircled region of FIG. 7 identified as 8-8.

FIG. 7 is a view similar to that of FIG. 5 following an additional optional processing step. FIG. 8 is an exploded view of the portion of FIG. 7 encircled there as 8-8. The article embodied in FIGS. 7 and 8 is designated by numeral 36 to reflect this additional processing. It is seen in FIGS. 7 and 8 that the additional processing has deposited highly conductive material 32 over the originally free surfaces of materials 28 and 30. Material 32 is normally metal-based such as copper or nickel, tin etc. Typical deposition techniques such as chemical or electrochemical metal deposition can be used for this additional optional process to produce the article 36. In a preferred embodiment, electrodeposition is chosen for its speed, ease, and cost effectiveness.

It is seen in FIGS. 7 and 8 that highly conductive material 32 extends through holes to electrically join and form electrically conductive surfaces on opposite sides of article 36. While shown as a single layer in the FIG. 7 and FIG. 8 embodiment, the highly conductive material can comprise multiple layers to achieve functional value. In particular, a layer of copper is often desirable for its high conductivity. Nickel is often desired for its adhesion characteristics, plateability and corrosion resistance. The exposed surface 39 of material 32 can be selected for corrosion resistance and bonding ability. In particular, tin or tin containing alloys are a possible choice of material to form the exposed surface of material 32. Tin and tin containing alloys melt at relatively low temperatures, which may be desirable to promote ohmic joining to other components in subsequent processing such as lamination.

The structures and articles such as those embodied in FIGS. 4 though 8 are defined herein as forms of "interconnecting straps" or simply "straps".

Figure 9:
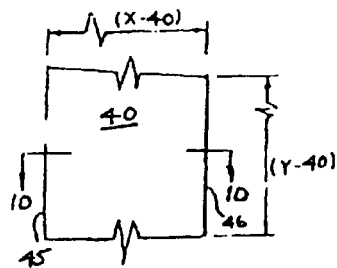
FIG. 9 is a top plan view of a photovoltaic cell useful in the practice of the invention.
Figure 10:
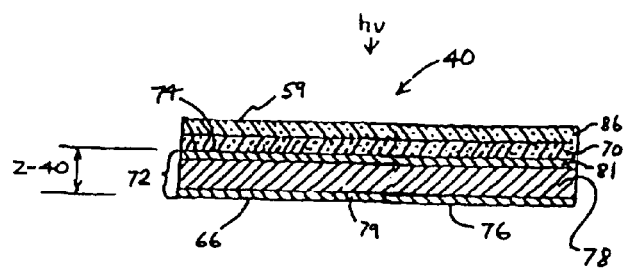
FIG. 10 is a sectional view taken substantially from the perspective of lines 10-10 of FIG. 9.

Referring now to FIGS. 9 and 10, there is embodied a thin film photovoltaic cell generally identified by the numeral 40. Cell 40 has a light incident top surface 59 and a bottom surface 66. Cell 40 has a width X-40 and length Y-40. Width X-40 defines a first photovoltaic cell terminal edge 45 and second photovoltaic cell terminal edge 46. In some cases, particularly during initial cell manufacture, dimension Y-40 may be considerably greater than dimension X-40 such that cell 40 can generally be described as "continuous" or being able to be processed in a roll-to-roll fashion. However, this "continuous" characteristic is not a requirement for the instant invention. FIG. 10 shows that cell 40 comprises a thin film semiconductor structure 70 supported on metal-based foil 72. Foil 72 has a first surface 74, second surface 76, and thickness Z-40. Metal-based foil 72 may be of uniform composition or may comprise a laminate of two or more metal-based layers. For example, foil 72 may comprise a base layer of inexpensive and processable material 78 with an additional metal-based layer 81 disposed between base layer 78 and semiconductor material 70. The additional metal-based layer may be chosen to ensure good ohmic contact between the top surface 74 of foil 72 and semiconductor structure 70. Bottom surface 76 of foil 72 may comprise a material 79 chosen to achieve good electrical and mechanical joining characteristics as will become clear in the subsequent teachings. The thickness Z-40 is often chosen such that cell 40 remains flexible for roll-to-roll handling and to minimize weight. However, the invention is not limited to flexible, lightweight cells and the teachings contained herein can be applied to rigid cells such as those comprising glass substrates or superstrates or those comprising single crystal silicon cells.

Figure 11:
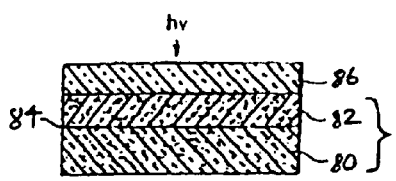
FIG. 11 is an exploded sectional view showing the detail of the structure identified as layers 70 and 86 in FIG. 10.

Semiconductor structure 70 can be any of the photovoltaic structures known in the art. Included are cells comprising single crystal silicon, polycrystalline silicon, thin film cells such as those comprising CuS, CIS, CIGS and CdTe, and cells comprising polymer based semiconductors. In its simplest form, a photovoltaic cell combines an n-type semiconductor with a p-type semiconductor to form an n-p junction. Most often an optically transparent window electrode, identified as 86 in FIG. 10, such as a thin film of zinc or tin oxide is employed to minimize resistive losses involved in current collection. FIG. 11 illustrates an example of a typical photovoltaic cell structure in section. In the figures, an arrow labeled "hv" is used to indicate the light incident side of the structure. In FIG. 11, 80 represents a thin film of a p-type semiconductor, 82 a thin film of n-type semiconductor and 84 the resulting photovoltaic junction. Window electrode 86 completes the typical photovoltaic structure.

Figure 12:
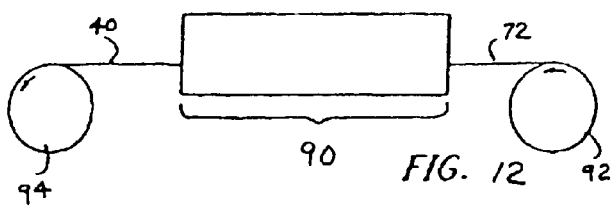
FIG. 12 is a simplified depiction of one form of process possible in the manufacture of the article embodied in FIGS. 9 and 10.

FIG. 12 presents one method of manufacture of a foil supported photovoltaic structure such as embodied in FIGS. 9 and 10. The metal-based foil 72 is moved in the direction of its length Y through a deposition process, generally indicated by numeral 90. Process 90 accomplishes deposition of the active photovoltaic structure onto foil 72. Foil 72 is unwound from supply roll 92, passed through deposition process 90 and rewound onto takeup roll 94. Process 90 can comprise any of the processes well-known in the art for depositing thin film photovoltaic structures. These processes include electroplating, vacuum sputtering, and chemical deposition. Process 90 may also include treatments, such as heat treatments or slitting, intended to enhance performance or manufacturing ability.

Figure 13:
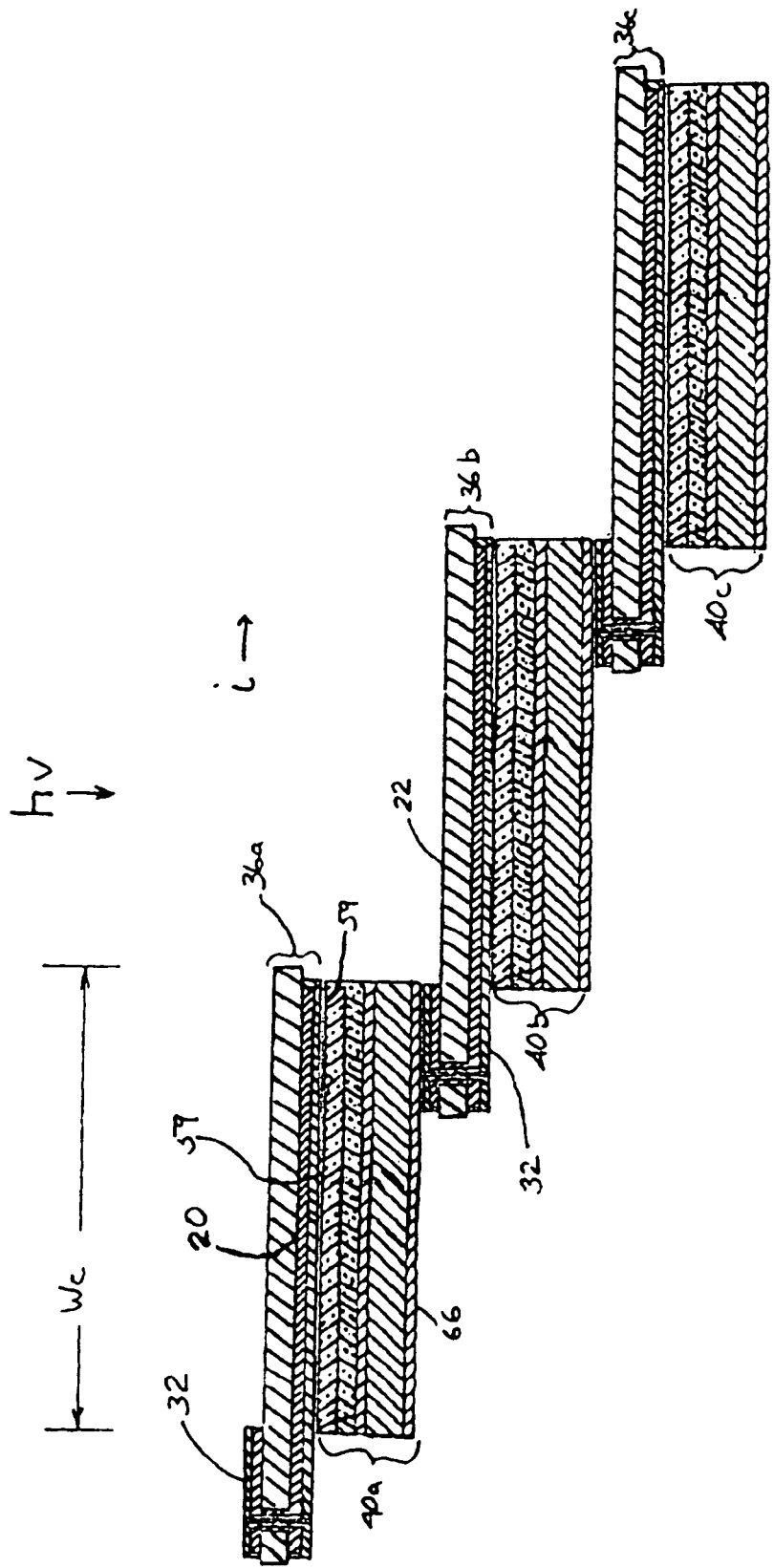
FIG. 13 is a sectional view showing one embodiment of an arrangement appropriate to combine the articles of FIG. 7 with the article of FIGS. 9 and 10 to achieve a series interconnected photovoltaic assembly.

One method of combining the interconnect "straps" embodied in FIGS. 4-6 and optionally in FIGS. 7 and 8 with the photovoltaic cells embodied in FIGS. 9 and 10 is illustrated in FIG. 13. In the FIG. 13 structure, individual straps 36a, 36b, 36c, are combined with cells 40a, 40b, 40c to form a series interconnected array. This may be accomplished via the following process.

1. An individual strap, such as 36a, is combined with a cell such as 40a by positioning the free surface 20 of solid surface region We of strap 36a in registration with the light incident surface 59 of cell 40a. Adhesion joining the two surfaces is accomplished by a suitable process. It is envisioned that batch or continuous laminating processing, such as that widely used in the food packaging industry would be one suitable method to accomplish this surface joining. In particular, the material forming the remaining free surface 20 of article 36a (that portion of surface 20 not covered with conductive material 32) can be chosen to promote good adhesion between the sheetlike article 36a and cell 40a during a surface laminating process. Also, as mentioned above, the nature of the free surface of conductive material 32 may be manipulated and chosen to further guarantee ohmic joining and adhesion. The laminating process brings the conductive material of fingers 26 into firm and effective contact with the transparent conductive material 86 forming surface 59 of cell 40a.

2. Subsequently or concurrently with Step 1, the conductive material 32 extending over the second surface 22 of strap 36b is ohmically adhered to the bottom surface 66 of cell 40a. This joining is accomplished by suitable electrical joining techniques such as soldering, riveting, spot welding or conductive adhesive application. The particular ohmic joining technique is not shown in the FIG. 13. However, a particularly suitable conductive adhesive is one based on a carbon black filler in a polymer matrix. Such adhesive formulations are relatively inexpensive. Despite the fact that carbon black formulations have relatively high intrinsic resistivities (of the order 1 ohm-cm.), the bonding in this embodiment is accomplished through a relatively thin adhesive layer and over a broad surface. Thus the resulting resistance losses are relatively limited. Strap 36b extends over the light incident surface of cell 40b.

FIG. 13 embodies three cells assembled in a series arrangement using the teachings of the instant invention. In FIG. 13, "i" indicated the direction of net current flow. It is noted that the arrangement of FIG. 13 resembles a shingling arrangement of cells, but with an important distinction. The prior art shingling arrangements have included an overlapping of cells at a sacrifice of portions of very valuable cell surface. In the FIG. 13 teaching, the benefits of the shingling interconnection concept are achieved without any loss of photovoltaic surface from shading by an overlapping cell. In addition, the FIG. 13 arrangement retains a high degree of flexibility because there is no immediate overlap of the metal foil structure.

EXAMPLE

A standard plastic laminating sheet from GBC Corp. was coated with DER in the pattern of repetitive fingers joined along one end with a busslike structure resulting in an article as embodied in FIGS. 1A and 2A. The fingers were 0.020 inch wide, 1.625 inch long and were repetitively separated by 0.150 inch. The buss-like structure which contacted the fingers extended in a direction perpendicular to the fingers as shown in FIG. 2A. The buss-like structure had a width Wi of 0.25 inch. Both the finger pattern and buss-like structure were printed simultaneously using the same DER ink and using silk screen printing. The DER printing pattern was applied to the laminating sheet surface formed by the sealing layer (i.e. that surface facing to the inside of the standard sealing pouch).

The finger/buss pattern thus produced on the lamination sheet was then electroplated with nickel in a standard Watts nickel bath at a current density of 50 amps. per sq. ft. Approximately 4 micrometers of nickel thickness was deposited to the overall pattern.

A photovoltaic cell having surface dimensions of 1.75 inch wide by 2.0625 inch long was used. This cell was a CIGS semiconductor type deposited on a 0.001 inch stainless steel substrate. A section of the laminating sheet containing the electroplated buss/finger pattern was then applied to the top, light incident side of the cell, with the electroplated grid finger extending in the width direction (1.75 inch dimension) of the cell. Care was taken to ensure that the buss or interconnect region, Wi, of the electroplated laminate did not overlap the cell surface. This resulted in a total cell surface of 3.61 sq. inch. (2.0625"×1.75") with about 12% shading from the grid, (i.e. about 88% open area for the cell).

The electroplated "finger/buss" on the lamination film was applied to the photovoltaic cell using a standard Xerox office laminator. The resulting completed cell showed good appearance and connection.

The cell prepared as above was tested in direct sunlight for photovoltaic response. Testing was done at noon, Morgan Hill, Calif. on April 8 in full sunlight. The cell recorded an open circuit voltage of 0.52 Volts. Also recorded was a "short circuit" current of 0.65 Amp. This indicates excellent power collection from the cell at high efficiency of collection.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. An article comprising a first photovoltaic cell and an interconnection component wherein,
    said first photovoltaic cell comprises a first material cell layer,
    said first photovoltaic cell further comprises a second material cell layer forming an upward facing light incident surface of said first photovoltaic cell,
    said interconnection component comprises a substrate whereby said substrate has length, width and thickness, and wherein said length and width are greater than said thickness,
    said substrate comprises one or more polymeric layers, and further has an outer downward facing bottom side and an outer upward facing top side,
    said substrate length and width dimensions defining terminal boundaries of said substrate,
    said interconnection component further comprises a collection region and an interconnection structure,
    said collection region comprises a transparent or translucent portion of said substrate wherein the outer downward facing bottom side of said substrate is formed by one of said one or more polymeric layers,
    said collection region is further characterized as having a pattern comprising a first electrically conductive material, said pattern extending over the collection region and positioned on and directly contacting said outer downward facing bottom side of said substrate, and wherein said first electrically conductive material does not include any of said second material cell layer forming said upward facing light incident surface of said first photovoltaic cell,
    said interconnection structure further comprises additional electrically conductive material, a first portion of said additional electrically conductive material extends from said outer downward facing bottom side of said substrate to said outer upward facing top side of said substrate, and a second portion of said additional electrically conductive material is supported on said outer upward facing top side of said substrate,
    said first and second portions of said additional electrically conductive material are in ohmic electrical communication with each other and with said first electrically conductive material of said pattern,
    said portion of said substrate associated with said collection region and said pattern overlay a preponderance of said upward facing light incident surface of said first photovoltaic cell with the outer downward facing bottom side of said substrate facing said upward facing light incident surface of said first photovoltaic cell such that a portion of said first electrically conductive material of said pattern is between said outer downward facing bottom side of said substrate and said upward facing light incident surface of said first photovoltaic cell and is in direct physical contact with said upward facing light incident surface of said first photovoltaic cell.

2. The article of claim 1 wherein no portion of said first electrically conductive material or said additional electrically conductive material is positioned outside said terminal boundaries of said substrate.

3. The article of claim 1 wherein said upward facing light incident surface of said first photovoltaic cell is formed by an unbroken layer of transparent or translucent electrically conductive material.

4. The article of claim 3 wherein said transparent or translucent electrically conductive material comprises a conductive metal oxide.

5. The article of claim 3 wherein said upward facing light incident surface of said first photovoltaic cell is substantially smooth.

6. The article of claim 3 wherein ohmic electrical communication exists between said transparent or translucent electrically conductive material forming said upward facing light incident surface of said first photovoltaic cell and said first electrically conductive material of said pattern.

7. The article of claim 1 wherein a monolithic electrically conductive material extends throughout the entire pattern overlaying a preponderance of said upward facing light incident surface of said first photovoltaic cell and said monolithic electrically conductive material is also common to and further contributes to both said first and second portions of said additional electrically conductive material.

8. The article of claim 7 wherein said monolithic electrically conductive material comprises a continuous metal.

9. The article of claim 1 wherein at least a portion of said outer downward facing bottom side of said substrate associated with said collection region is formed by a layer of adhesive material which is adhesively bonded in direct contact with said upward facing light incident surface of said first photovoltaic cell.

10. The article of claim 1 wherein said pattern comprises multiple substantially parallel line segments comprising metallic material and wherein connecting metallic material extends to connect two adjacent line segments, said connecting metallic material extending only from distal ends of said two adjacent parallel line segments, and wherein said metallic material associated with said two adjacent parallel line segments and said connecting metallic material comprise a monolithic material common to said two adjacent parallel line segments and said connecting material.

11. The article of claim 1 wherein said portion of said first electrically conductive material in direct physical contact with said upward facing light incident surface of said first photovoltaic cell comprises an electrically conductive coating over a base structure.

12. The article of claim 11 wherein said electrically conductive coating comprises nickel or tin and is absent polymeric material.

13. The article of claim 11 wherein said electrically conductive coating comprises a polymeric adhesive.

14. The article of claim 1 wherein said first photovoltaic cell comprises a self supporting metal based foil and wherein said first material cell layer comprising semiconductor material overlays the full expanse of an upward facing top surface of said metal based foil.

15. The article of claim 1 wherein said electrical communication between said first electrically conductive material of said pattern and said second portion of said additional electrically conductive material on the outer upward facing top side of said substrate is established using holes extending through said substrate from said outer downward facing bottom side of said substrate to said outer upward facing top side of said substrate, and wherein said first portion of said additional electrically conductive material extends through said holes to electrically connect said first electrically conductive material of said pattern positioned on said outer downward facing bottom side of said substrate and said second portion of said additional electrically conductive material on said outer upward facing top side of said substrate.

16. The article of claim 9 wherein said adhesive material is a laminating adhesive whose adhesive affinity for said upward facing light incident surface of said first photovoltaic cell is activated by elevated temperature and pressure whereby said adhesive material becomes fluid when said temperature and pressure are increased sufficiently above ambient.

17. The article of claim 1 further comprising a second photovoltaic cell, said second photovoltaic cell having a downward facing bottom surface, and at least a portion of said downward facing bottom surface of said second photovoltaic cell is formed by a metallic material, and wherein said second portion of said additional electrically conductive material is positioned between said substrate and said portion of said downward facing bottom surface of said second photovoltaic cell formed by metallic material and is in direct contact with said portion of said downward facing bottom surface of said second photovoltaic cell formed by metallic material.

18. An article comprising a first photovoltaic cell and an interconnection component wherein,
    said first photovoltaic cell comprises a layer of photovoltaic semiconductor material, said semiconductor layer having a first surface intended to face toward a light source, said semiconductor layer further having terminal edges defining boundaries encompassing an area associated with said first surface,
    said first photovoltaic cell further comprises a transparent or translucent material layer which forms an upward facing light incident surface, and wherein said transparent or translucent material does not extend outside the boundaries encompassing said area of said first semiconductor surface such that a straight line normal to said upward facing light incident surface passing through any point of said upward facing light incident surface also passes through said photovoltaic semiconductor layer,
    said interconnection component comprises a substrate whereby said substrate has length width and thickness and wherein said length and width are greater than said thickness,
    said substrate comprises one or more polymeric layers, and further has an outer downward facing bottom side and an outer upward facing top side,
    said substrate length and width dimensions defining terminal boundaries of said substrate,
    said interconnection component is further characterized as having a collection region and an interconnection structure,
    said collection region comprises a transparent or translucent portion of said substrate wherein said outer downward facing bottom side of said substrate is formed by one or more of said polymeric layers,
    said collection region is further characterized as having a pattern comprising a first electrically conductive material, said pattern extending over the collection region and positioned on and directly contacting said outer downward facing bottom side of said substrate, and wherein said first electrically conductive material does not include any of the material forming said upward facing light incident surface of said first photovoltaic cell,
    said interconnection structure comprises additional electrically conductive material, a first portion of said additional electrically conductive material extends from said outer downward facing bottom side of said substrate to said outer upward facing top side of said substrate, and a second portion of said additional electrically conductive material is supported on the outer upward facing top side of said substrate,
    said first and second portions of said additional electrically conductive material are in ohmic electrical communication with each other and with said first electrically conductive material of said pattern, said portion of said substrate associated with said collection region and said pattern overlay a preponderance of said upward facing light incident surface of said first photovoltaic cell with the outer downward facing bottom side of said substrate facing said light incident surface of said first photovoltaic cell such that a portion of said first electrically conductive material of said pattern is between said outer downward facing bottom side of said substrate and said upward facing light incident surface of said first photovoltaic cell and is in direct physical contact with said upward facing light incident surface of said first photovoltaic cell.

19. The article of claim 18 wherein said transparent or translucent material layer forming said upward facing light incident surface of said first photovoltaic cell comprises a transparent or translucent conductive metal oxide.

20. The article of claim 19 wherein said upward facing light incident surface of said first photovoltaic cell is substantially smooth.

21. The article of claim 18 wherein said transparent or translucent material layer forming said upward facing light incident surface of said first photovoltaic cell comprises conductive material particles dispersed in a polymeric matrix.

22. The article of claim 18 wherein no portion of said first electrically conductive material or said additional electrically conductive material extends outside said terminal boundaries of said substrate.

23. The article of claim 18 further comprising a second photovoltaic cell wherein, said second photovoltaic cell has a bottom surface facing downward and away from a light incident surface, and a portion of said downward facing bottom surface is formed by a metallic layer, and wherein, said electrical communication between said first electrically conductive material of said pattern and said second portion of said additional conductive material on the outer upward facing top side of said substrate is established using holes extending through said substrate from said outer downward facing bottom side of said substrate to said outer upward facing top side of said substrate, and wherein, said first portion of said additional electrically conductive material extends through said holes to electrically connect said first electrically conductive material of said pattern positioned on said outer downward facing bottom side of said substrate and said second portion of additional electrically conductive material on said outer upward facing top side of said substrate, and wherein, said second portion of said additional electrically conductive material is positioned between said substrate and said portion of downward facing bottom surface of said second cell.

24. The article of claim 1 wherein said interconnection component is flexible.

25. The article of claim 18 wherein portions of said outer downward facing bottom side of said substrate associated with said collection portion are in direct physical contact with said upward facing light incident surface of said first photovoltaic cell.

26. The article of claim 25 wherein said outer downward facing bottom side of said substrate associated with said collection region is formed by a layer comprising polymeric adhesive and wherein portions of said downward facing bottom side of said substrate associated with said collection region are adhesively bonded in direct physical contact with said upward facing light incident surface of said first photovoltaic cell.

* * * * *